(12) United States Patent
Ryu

(10) Patent No.: US 11,650,940 B2
(45) Date of Patent: May 16, 2023

(54) STORAGE DEVICE INCLUDING RECONFIGURABLE LOGIC AND METHOD OF OPERATING THE STORAGE DEVICE

(71) Applicant: SAMSUNG ELECTRONICS CO., LTD., Suwon-si (KR)

(72) Inventor: Sueng-Chul Ryu, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/148,011

(22) Filed: Jan. 13, 2021

(65) Prior Publication Data

US 2021/0133125 A1 May 6, 2021

Related U.S. Application Data

(63) Continuation of application No. 17/080,614, filed on Oct. 26, 2020, which is a continuation of application
(Continued)

(30) Foreign Application Priority Data

May 23, 2018 (KR) .......................... 10-2018-0058641

(51) Int. Cl.
*G06F 13/16* (2006.01)
*G06F 3/06* (2006.01)
(Continued)

(52) U.S. Cl.
CPC ........ *G06F 13/1668* (2013.01); *G06F 3/0604* (2013.01); *G06F 3/0659* (2013.01); *G06F 3/0679* (2013.01); *G06F 30/34* (2020.01)

(58) Field of Classification Search
CPC ............ G11C 16/14; G11C 16/26; G11C 8/11
See application file for complete search history.

(56) References Cited

U.S. PATENT DOCUMENTS 5,887,165 A   3/1999  Martel
5,946,219 A   8/1999  Mason et al.
(Continued)

FOREIGN PATENT DOCUMENTS

JP   2006162285 A   6/2006
JP     5373620 B2  12/2013
(Continued)

OTHER PUBLICATIONS

Preliminary Opinion dated Mar. 24, 2022 in EP Patent Application No. 19163488.0.
(Continued)

*Primary Examiner* — Getente A Yimer
(74) *Attorney, Agent, or Firm* — Volentine, Whitt & Francos, PLLC

(57) ABSTRACT

A storage device includes a reconfigurable logic circuit, a control logic circuit, and non-volatile memory. The reconfigurable logic circuit is changeable from a first accelerator to a second accelerator during an operation of the storage device. The control logic circuit is configured to receive, from the host, a host command including information about a function required by the host and dynamically reconfigure the reconfigurable logic circuit such that the reconfigurable logic circuit performs the function according to the received host command. The non-volatile memory is connected to the control logic circuit.

35 Claims, 18 Drawing Sheets

Related U.S. Application Data

No. 16/363,791, filed on Mar. 25, 2019, now Pat. No. 10,817,440.

(51) Int. Cl.
*G06F 30/34* (2020.01)
*G06F 15/78* (2006.01)

(56) References Cited

U.S. PATENT DOCUMENTS

| | | | |
|---|---|---|---|
| 6,539,438 | B1 | 3/2003 | Ledzius et al. |
| 7,127,601 | B2 | 10/2006 | Cheon |
| 7,171,548 | B2 | 1/2007 | Smith |
| 7,265,578 | B1 | 9/2007 | Tang et al. |
| 7,480,491 | B2 | 1/2009 | Elayda, III et al. |
| 7,617,470 | B1 | 11/2009 | Dehon |
| 8,560,996 | B1 | 10/2013 | Brebner et al. |
| 9,191,617 | B1 | 11/2015 | James et al. |
| 9,570,147 | B2 | 2/2017 | Kim |
| 10,275,288 | B2 | 4/2019 | Pinto et al. |
| 11,079,936 | B2 | 8/2021 | Chang et al. |
| 2002/0026549 | A1 | 2/2002 | Powers et al. |
| 2005/0108290 | A1 | 5/2005 | Mita et al. |
| 2008/0051075 | A1* | 2/2008 | Einloth ............ H04M 3/42161 717/176 |
| 2008/0262984 | A1 | 10/2008 | Xu et al. |
| 2010/0042751 | A1 | 2/2010 | Ishino et al. |
| 2013/0297907 | A1 | 11/2013 | Ki et al. |
| 2018/0046894 | A1 | 2/2018 | Yao |
| 2018/0101633 | A1 | 4/2018 | Phoon et al. |
| 2018/0139110 | A1 | 5/2018 | Johnson et al. |
| 2019/0005945 | A1* | 1/2019 | Hofer .................. G06N 3/0445 |
| 2019/0107956 | A1 | 4/2019 | Kachare et al. |
| 2019/0138210 | A1 | 5/2019 | Lindholm |
| 2019/0146696 | A1 | 5/2019 | D'Abreau et al. |
| 2019/0189221 | A1* | 6/2019 | Kim ..................... G11C 7/1057 |
| 2019/0312593 | A1* | 10/2019 | Hsiao ................. G06F 11/1068 |
| 2021/0035258 | A1* | 2/2021 | Ray ........................... G06N 3/08 |
| 2021/0133361 | A1* | 5/2021 | Fishel .................. G06N 3/0454 |

FOREIGN PATENT DOCUMENTS

| | | |
|---|---|---|
| KR | 1020090041528 A | 4/2009 |
| KR | 10-2016-0086507 | 7/2016 |
| KR | 10-2017-0102418 | 9/2017 |
| WO | WO 2016-210014 A1 | 12/2016 |

OTHER PUBLICATIONS

Singapore Office Action dated Jul. 27, 2022 Cited in Corresponding SG Patent Application No. 10201901671Q.

Korean Office Action dated Oct. 17, 2022, Cited in KR Patent Application No. 10-2018-0058641.

\* cited by examiner

MAPPING TABLE FOR NVM

| DESIGN FILE | PPN |
|---|---|
| DF1a | PPN1a |
| DF2a | PPN2a |
| DF3a | PPN3a |
| . . . | . . . |

MAPPING TABLE FOR VM

| DESIGN FILE | PPN |
|---|---|
| DF1b | PPN1b |
| DF2b | PPN2b |
| DF3b | PPN3b |
| . . . | . . . |

STORAGE DEVICE INCLUDING RECONFIGURABLE LOGIC AND METHOD OF OPERATING THE STORAGE DEVICE

CROSS-REFERENCE TO RELATED APPLICATION

This is a Continuation of U.S. application Ser. No. 17/080,614, filed Oct. 26, 2020, which is a Continuation of U.S. application Ser. No. 16/363,791, filed Mar. 25, 2019, issued as U.S. Pat. No. 10,817,440 on Oct. 27, 2020, and a claim of priority under 35 U.S.C. § 119 is made to Korean Patent Application No. 10-2018-0058641, filed on May 23, 2018 in the Korean Intellectual Property Office, the disclosure of which is incorporated herein in its entirety by reference.

BACKGROUND

1. Technical Field

The present disclosure relates to storage devices. More particularly, the present disclosure relates to a storage device that includes a reconfigurable logic circuit, and a method of operating the storage device.

2. Description of Related Art

Storage systems may include a host and a storage device. To increase a processing speed of storage systems, the storage systems may further include an accelerator that helps a calculation of the host by performing some of the calculations performed by the host. When the accelerator is disposed outside a storage device, the time taken for a calculation operation of the accelerator may increase according to the time taken to input or output data between the host, the storage device, and the accelerator.

The accelerator may be classified as a dedicated hardware accelerator that performs a set function, or a reconfigurable accelerator that is reconfigurable according to a design file, such as a field programmable gate array (FPGA) image. Recently, because the host is required to perform various applications and process each application at high speed, a reconfigurable accelerator, such as an FPGA, reconfigurable to correspond to the various applications is in high demand.

SUMMARY

The present disclosure provides a storage device, a storage system including the storage device, and a method of operating the storage device. The storage device includes a reconfigurable logic circuit that is adaptively reconfigurable according to a function required by a host during an operation of the storage device.

According to an aspect of the present disclosure, a storage device includes a reconfigurable logic circuit, a control logic circuit, and non-volatile memory. The storage device is capable of communicating with a host. The reconfigurable logic circuit is changeable from a first accelerator to a second accelerator during an operation of the storage device. The control logic circuit is configured to receive, from the host, a host command including information about a function required by the host and dynamically reconfigure the reconfigurable logic circuit such that the reconfigurable logic circuit performs the function according to the received host command. The non-volatile memory is connected to the control logic circuit.

According to another aspect of the present disclosure, a storage system includes a storage device and a host. The storage device includes a reconfigurable logic circuit. The host is capable of executing multiple applications and is configured to decide reconfiguration of the reconfigurable logic circuit such that the reconfigurable logic circuit operates as a first accelerator corresponding to a first application from among the applications. The host is also configured to transmit a first host command including information about the first application to the storage device. The reconfigurable logic circuit is reconfigured to the first accelerator according to the first host command.

According to another aspect of the present disclosure, storage device includes a reconfigurable logic circuit. A method of operating the storage device includes receiving, by the storage device from a host, a host command including information about a function required by the host. The method of operating the storage device also includes the storage device dynamically reconfiguring the reconfigurable logic circuit to correspond to the function, by downloading, into the reconfigurable logic circuit, a design file for implementing the function into the reconfigurable logic circuit, according to the host command.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Figure 1:
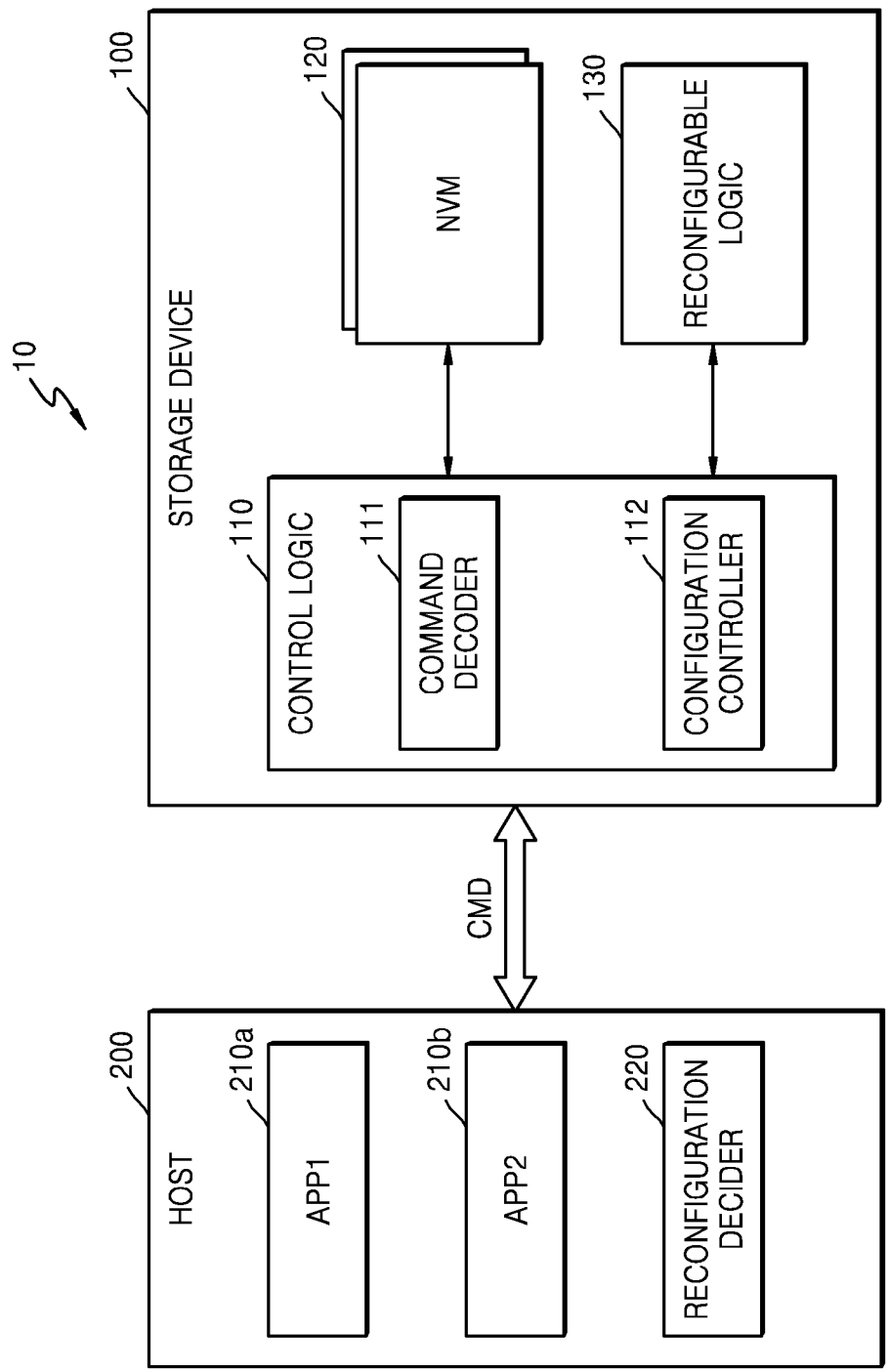
FIG. 1 is a block diagram illustrating a storage system according to an embodiment of the present disclosure.

FIG. 1 is a block diagram illustrating a storage system 10 according to an embodiment of the present disclosure.

Referring to FIG. 1, the storage system 10 may include a storage device 100 and a host 200, and the storage device 100 may include a control logic 110, an NVM 120 (non-volatile memory), and a reconfigurable logic 130. The reconfigurable logic 130 may be an accelerator that helps a calculation of the host 200 by performing some of the calculations performed by the host 200. For example, the reconfigurable logic 130 may be a field programmable gate array (FPGA). However, the reconfigurable logic 130 is not limited thereto, and the reconfigurable logic 130 may be a programmable logic device (PLD) or a complex PLD (CPLD). In other words, references to logic such as control logic 110 and reconfigurable logic 130 herein are references to a circuit of one or more circuit elements such as a FPGA, a PLD, a CPLD, and/or a processor including an application-specific integrated circuit (ASIC). Moreover, in FIGS. herein including FIG. 1, circuitry may be shown as, for example, a "decider", a "decoder", a "controller", an "accelerator", and a "processor". As is traditional in the field of the inventive concept(s) described herein, examples may be described and illustrated in terms of blocks which carry out a described function or functions. These blocks, which may be referred to herein as a decider, a decoder, a controller, an accelerator, and a processor (in addition to those referred to as logic), or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the examples may be physically separated into two or more interacting and discrete blocks without departing from the scope of the inventive concepts. Likewise, the blocks of the examples may be physically combined into more complex blocks without departing from the scope of the inventive concepts.

According to an embodiment, the control logic 110 may be implemented as a first chip, the reconfigurable logic 130 may be implemented as a second chip, and the first chip and the second chip may be mounted on a single board and may be electrically connected to each other. According to an embodiment, the control logic 110 may be implemented as a first chip, the reconfigurable logic 130 may be implemented as a second chip, and the first chip and the second chip may constitute a package-on-package (POP). For example, the control logic 110 may be implemented using an application specific integrated circuit (ASIC) chip, and the reconfigurable logic 130 may be implemented using an FPGA.

The reconfigurable logic 130 may be reconfigured according to a host command CMD including information about a function required by the host 200. According to an embodiment, the host command CMD may include information about an application that is executed by the host 200. According to an embodiment, the host command CMD may include design file information corresponding to an application that is executed by the host 200.

In detail, the control logic 110 may download or program, in the reconfigurable logic 130, a design file for programming the reconfigurable logic 130, based on the host command CMD. For example, when the reconfigurable logic 130 is an FPGA, the design file may be an FPGA image, and the control logic 110 may reconfigure the reconfigurable logic 130 by downloading the FPGA image into the reconfigurable logic 130.

The design file may define a connection between logic blocks included in the reconfigurable logic 130, interconnections, and input/output (I/O) cells. The design file may be implemented in a Very High Speed Integrated Circuit (VHSIC) Hardware Description Language (VHDL), or a Hardware Description Language (HDL) such as Verilog. In detail, the design file may be generated by a synthesis via a register transfer level (RTL) design or may be generated via a top-level compile after coding of a software kernel and a hardware kernel by using an Open Computing Language (CL).

According to the type of design file downloaded by the reconfigurable logic 130, the type of calculation performed by the reconfigurable logic 130 may vary. For example, when a first design file is downloaded into the reconfigurable logic 130, the reconfigurable logic 130 may operate as a first accelerator, and, when a second design file is downloaded into the reconfigurable logic 130, the reconfigurable logic 130 may operate as a second accelerator. According to an embodiment, the reconfigurable logic 130 may be reconfigured according to the host command CMD during an operation of the storage system 10.

According to an embodiment, the reconfigurable logic 130 may perform multimedia transcoding or eraser coding. According to an embodiment, the reconfigurable logic 130 may perform a machine learning algorithm, such as a convolutional neural network (CNN) or a recurrent neural network (RNN). For example, the reconfigurable logic 130 may be configured to perform video transcoding and may be reconfigured to perform a CNN according to a host command CMD for instructing the CNN, during an operation of the storage system 10.

For example, the reconfigurable logic 130 may perform inline processing, pre-processing, pre-filtering, cryptography, compression, protocol bridging, and the like. For example, the reconfigurable logic 130 may perform at least one of a sorting operation, a searching operation, a logic operation, and an arithmetic operation. The logic operation may represent a calculation performed by any of various logic gates, such as an AND gate, an OR gate, an XOR gate, a NOR gate, a NAND gate, or a combination of two or more of these calculations. Examples of the calculations performed by the reconfigurable logic 130 are not limited thereto, and calculations performed by the reconfigurable logic 130 may be arbitrary calculations corresponding to some of the calculations performed by the host 200. That is, calculations performed by the reconfigurable logic 130 may be calculations that can be, may be, and sometimes or otherwise are performed by the host 200, but that are performed by the reconfigurable logic 130 dynamically and on-demand based on the host command CMD.

The host 200 may communicate with the storage device 100 via any of various interfaces. For example, the host 200 may be implemented using an application processor (AP) or a System-On-a-Chip (SoC). The host 200 may execute various applications including a first application (APP1) 210a and a second application (APP2) 210b. Additionally, the host may include a reconfiguration decider 220. The type of application that is executed by the host 200 may be determined by a user input. For example, the first application APP1 210a and the second application APP2 210b may be a multimedia reproducing application, an image recognition application, a voice recognition application, an encryption application, a search application, and the like.

The reconfiguration decider 220 may decide reconfiguration or non-reconfiguration of the reconfigurable logic 130 according to an application that the host 200 desires to execute. The reconfiguration decider 220 may generate a host command CMD including information about an application the host 200 desires to execute, a function corresponding to the application, or a design file corresponding to the application. This host command CMD may be referred to as a reconfiguration command.

The host 200 may transmit, to the storage device 100, a design file for reconfiguring the reconfigurable logic 130. The host 200 may transmit, to the storage device 100, control signals for controlling the reconfigurable logic 130. The host 200 may transmit, to the storage device 100, data on which a calculation is to be performed by the reconfigurable logic 130. The host 200 may receive, from the storage device 100, data generated by the calculation of the reconfigurable logic 130.

The control logic 110 may reconfigure the reconfigurable logic 130 in response to the host command CMD received from the host 200. The control logic 110 of the storage device 100 may include a command decoder 111 and a configuration controller 112. The command decoder 111 and the configuration controller 112 may be implemented using hardware, software, or firmware. The command decoder 111 may be referred to as a command detector. The configuration controller 112 may be referred to as a design file downloader, an image downloader, or a programming circuit.

The command decoder 111 may receive the host command CMD and may detect a function required by the host 200 from the received host command CMD. According to an embodiment, the command decoder 111 may determine whether a design file currently programmed in the reconfigurable logic 130 corresponds to the function required by the host 200. According to an embodiment, the command decoder 111 may determine whether a design file corresponding to the detected function has been stored in the NVM 120.

The host 200 be configured to transmit, to the control logic 110 of the storage device 100, a design file for programming the reconfigurable logic 130. The configuration controller 112 may receive the design file corresponding to the function required by the host 200 from the host 200 and may reconfigure the reconfigurable logic 130 by downloading or programming the received design file into the reconfigurable logic 130. The configuration controller 112 may program, in the reconfigurable logic 130, the received design file in order to implement the function into the reconfigurable logic 130. That is, the configuration controller 112 is configured to dynamically reconfigure the reconfigurable logic 130, by programming, in the reconfigurable logic 130, the design file for implementing the function into the reconfigurable logic 130. According to an embodiment, the configuration controller 112 may receive a design file from the host 200. According to an embodiment, the configuration controller 112 may receive a design file from the NVM 120.

The reconfigurable logic 130 may operate as an accelerator corresponding to an application that is executed by the host 200, by being reconfigured according to the host command CMD. Accordingly, the reconfigurable logic 130 may receive data from the host 200 or the NVM 120 and may perform a calculation on the received data according to the function required by the host 200. Then, the reconfigurable logic 130 may provide a result of the calculation to the host 200 or the NVM 120.

The host 200 may transmit a read request to the storage device 100, and the storage device 100 may read data from the NVM 120 in response to the read request. The control logic 110 may control data to be written to the NVM 120 in response to a write request received from the host 200. Alternatively, the control logic 110 may control data to be read from the NVM 120 in response to the read request received from the host 200.

The NVM 120 may include a memory cell array including multiple memory cells. According to an embodiment, the NVM 120 may include a flash memory device, for example, a NAND flash memory device. However, the NVM 120 is not limited thereto, and the NVM 120 may include a resistive memory device, such as resistive random-access memory (ReRAM), phase change RAM (PRAM), or magnetic RAM (MRAM).

According to an embodiment, the storage device 100 may be a block storage device that manages data in units of blocks. According to an embodiment, the storage device 100 may be an object storage device that manages data in units of objects. For example, the storage device 100 may be a key-value storage device. The key-value storage device fast and simply processes data by using a key-value pair. The key-value pair is a pair of a key having uniqueness and a value, which is data corresponding to the key, and may be referred to as a tuple or a key-value tuple. In the key-value pair, the key may be expressed as an arbitrary string, such as a file name, a uniform resource identifier (URI) or a hash, and the value may be any type of data, such as an image or a user preference file or document.

The storage system 10 may be implemented using, for example, a personal computer (PC), a data server, a network-coupled storage, an Internet of Things (IoT) device, or a portable electronic apparatus. The portable electronic apparatus may be a laptop computer, a mobile telephone, a smartphone, a tablet PC, a personal digital assistant (PDA), an enterprise digital assistant (EDA), a digital still camera, a digital video camera, an audio player, a portable multimedia player (PMP), a personal navigation device (PND), an MP3 player, a handheld game console, an e-book, a wearable apparatus, or the like.

According to some embodiments, the storage device 100 may be internal memory embedded in an electronic apparatus. For example, the storage device 100 may be a solid-state drive (SSD), an embedded Universal Flash Storage (UFS) memory device, or an embedded Multi-Media Card (eMMC). According to some embodiments, the storage device 100 may be external memory detachable from an electronic apparatus. For example, the storage device 100 may be a UFS memory card, a Compact Flash (CF) card, a Secure Digital (SD) card, a Micro-SD card, a Mini-SD card, an extreme Digital (xD) card or Memory Stick.

Figure 2:
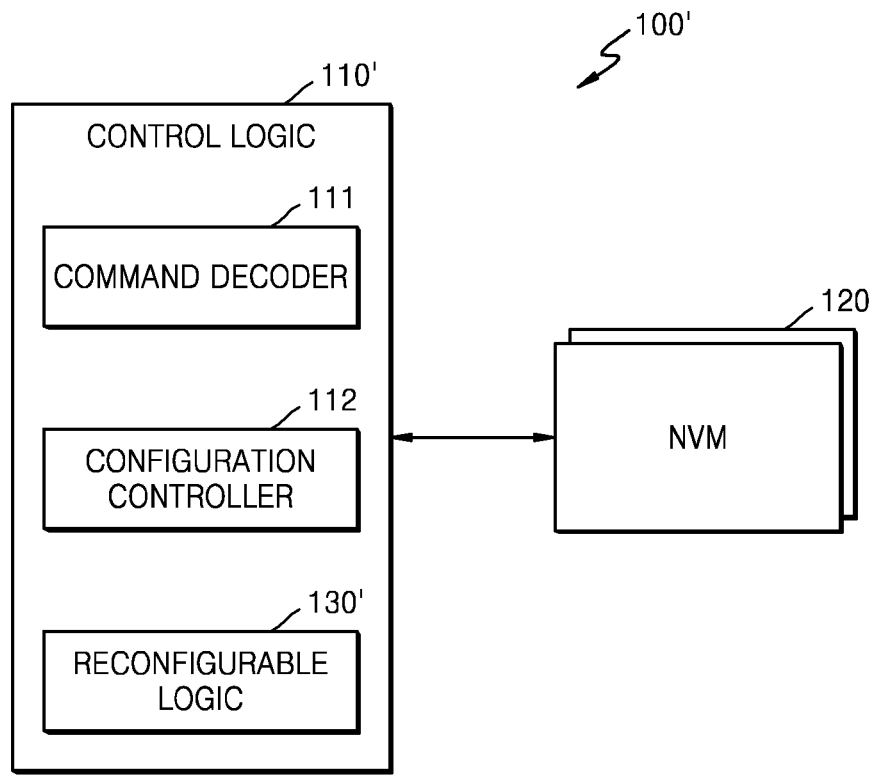
FIG. 2 is a block diagram illustrating a storage system according to another embodiment of the present disclosure.

FIG. 2 is a block diagram illustrating a storage device 100' according to another embodiment of the present disclosure.

Referring to FIG. 2, the storage device 100' may include a control logic 110' and the NVM 120. The storage device 100' corresponds to a modification of the storage device 100 of FIG. 1, and only differences between the storage device 100' and the storage device 100 of FIG. 1 are described.

According to the present embodiment, the control logic 110' may include the command decoder 111, the configuration controller 112, and a reconfigurable logic 130'. According to an embodiment, the control logic 110' may be implemented as a first chip, for example, an ASIC chip, and the reconfigurable logic 130' may be embedded into the first chip. That is, the control logic 110' and the reconfigurable logic 130' may be implemented in a single chip. According to an embodiment, the control logic 110' may be implemented using an FPGA. Various embodiments to be described below are applicable to the storage device 100 of FIG. 1 and the storage device 100' of FIG. 2.

Figure 3:
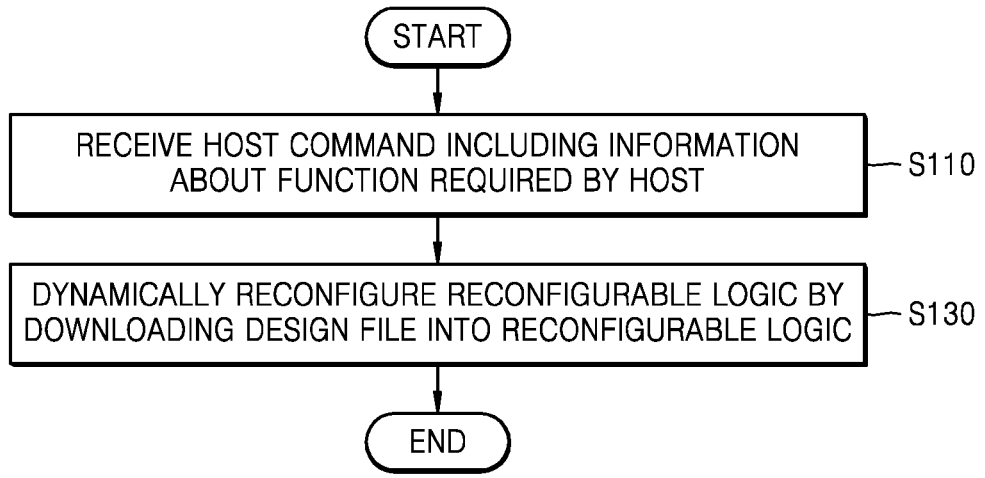
FIG. 3 is a flowchart illustrating a method of operating a storage device, according to an embodiment of the present disclosure.

FIG. 3 is a flowchart illustrating a method of operating a storage device, according to an embodiment of the present disclosure.

Referring to FIG. 3, the method of operating a storage device, according to the present embodiment, may be a method of reconfiguring a reconfigurable logic included in the storage device, and may include, for example, operations that are sequentially performed in the storage device 100 of FIG. 1. This will now be described in greater detail with reference to FIGS. 1 and 3.

In operation S110, the storage device 100 receives the host command CMD including the information about the function required by the host 200. Operation S110 may be performed during an operation of the storage device 100, in other words, during runtime. However, operation S110 is not limited thereto, and operation S110 may be performed at a time point when the storage device 100 is supplied with power or at a time point when the storage device 100 is reset.

In operation S130, the storage device 100 dynamically reconfigures the reconfigurable logic 130 by downloading a design file into the reconfigurable logic 130. As such, a trigger condition for reconfiguring the reconfigurable logic 130 is the host command CMD provided by the host 200, and the reconfigurable logic 130 may be reconfigured according to the host command CMD to perform a function corresponding to an application that is executed by the host 200.

In the related art, an FPGA image is programmed to an FPGA only at the moment when a system is supplied with power or reset. In other words, a trigger condition for FPGA reconfiguration is power supply or resetting, and a condition for re-programming or re-downloading an FPGA image into an FPGA is very limited. Accordingly, a very large and expensive FPGA is used to pre-program all functions required by a host to the FPGA.

However, according to the present embodiment, the storage device 100 may receive the host command CMD while the storage device 100 is operating, and may reconfigure the reconfigurable logic 130 in real time according to the host command CMD. Accordingly, all functions required by the host 200 do not need to be previously programmed to the reconfigurable logic 130, and a function currently required by the host 200 may be re-programmed to the reconfigurable logic 130 in real time. Thus, hardware resources for implementing the reconfigurable logic 130 may be reduced, and power consumption, an implementation area, and implementation costs associated with the reconfigurable logic 130 may be lowered.

Figure 4:
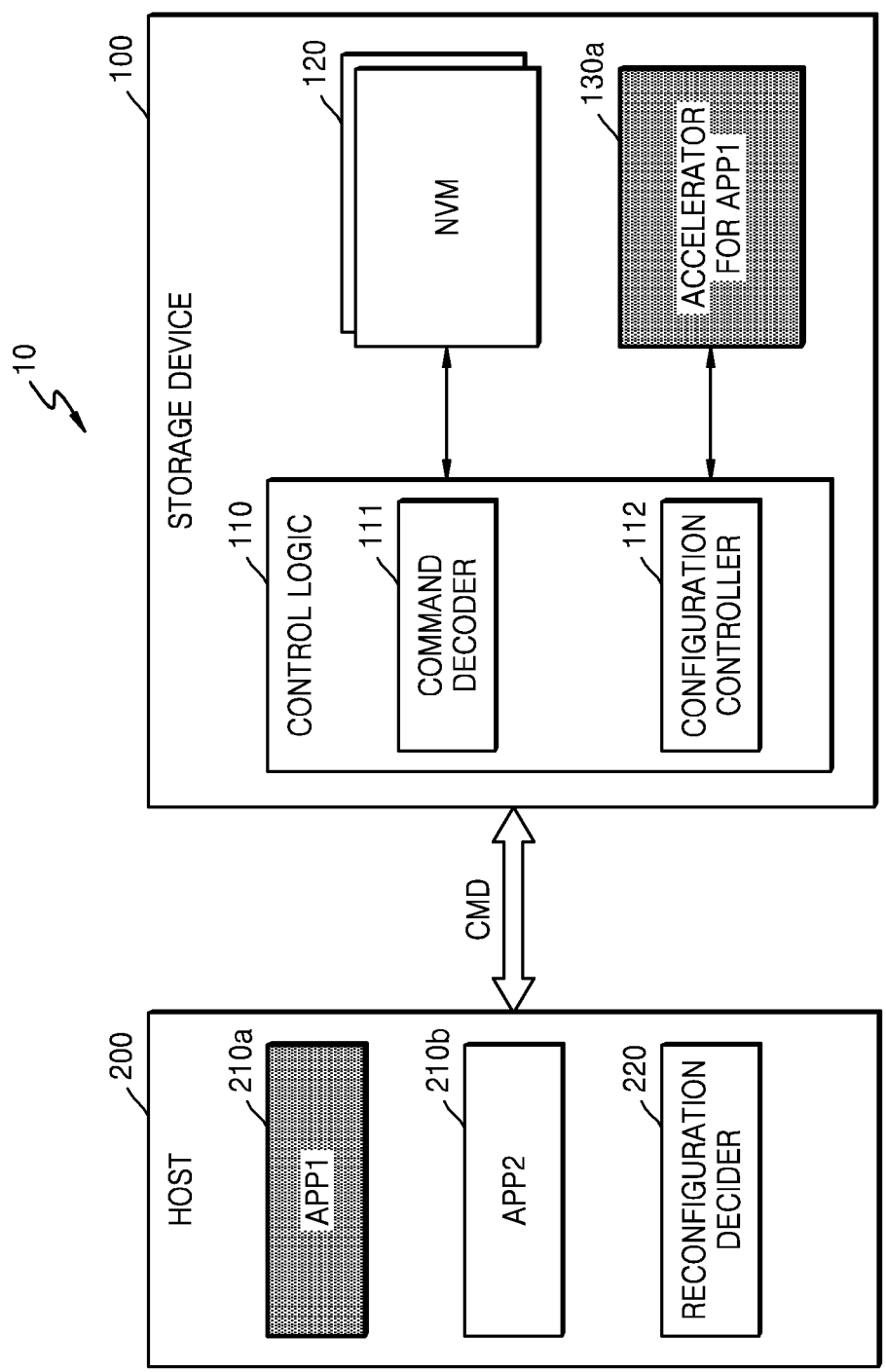
FIG. 4 is a block diagram illustrating an example in which a reconfigurable logic circuit included in a storage device included in the storage system of FIG. 1 is reconfigured to a first accelerator.

FIG. 4 is a block diagram illustrating an example in which the reconfigurable logic 130 included in the storage device 100 of FIG. 1 is reconfigured to a first accelerator 130a.

Referring to FIG. 4, when the first application APP1 210a is executed, the reconfiguration decider 220 may decide reconfiguration of the reconfigurable logic 130 so that the reconfigurable logic 130 may perform a function corresponding to the first application APP1 210a. Accordingly, the reconfigurable logic 130 may be reconfigured to the first accelerator 130a for the first application APP1 210a.

For example, the first application APP1 210a may be a voice or image recognition application, and the first accelerator 130a may perform a CNN necessary for voice or image recognition. As noted previously, the storage device 100 may include a control logic 110, and the control logic 110 may include a configuration controller 112. According to an embodiment, the host 200 may provide the storage device 100 with a first design file for reconfiguring the reconfigurable logic 130 to the first accelerator 130a. That is, the host 200 may be configured to transmit, to the storage device 100, the first design file for programming the reconfigurable logic 130 into the first accelerator 130a. The configuration controller 112 of the control logic 110 of the storage device 100 may be configured to dynamically reconfigure the reconfigurable logic 130, by programming, in the reconfigurable logic 130, the first design file for programming the reconfigurable logic into the first accelerator 130a according to a first host command.

Figure 5:
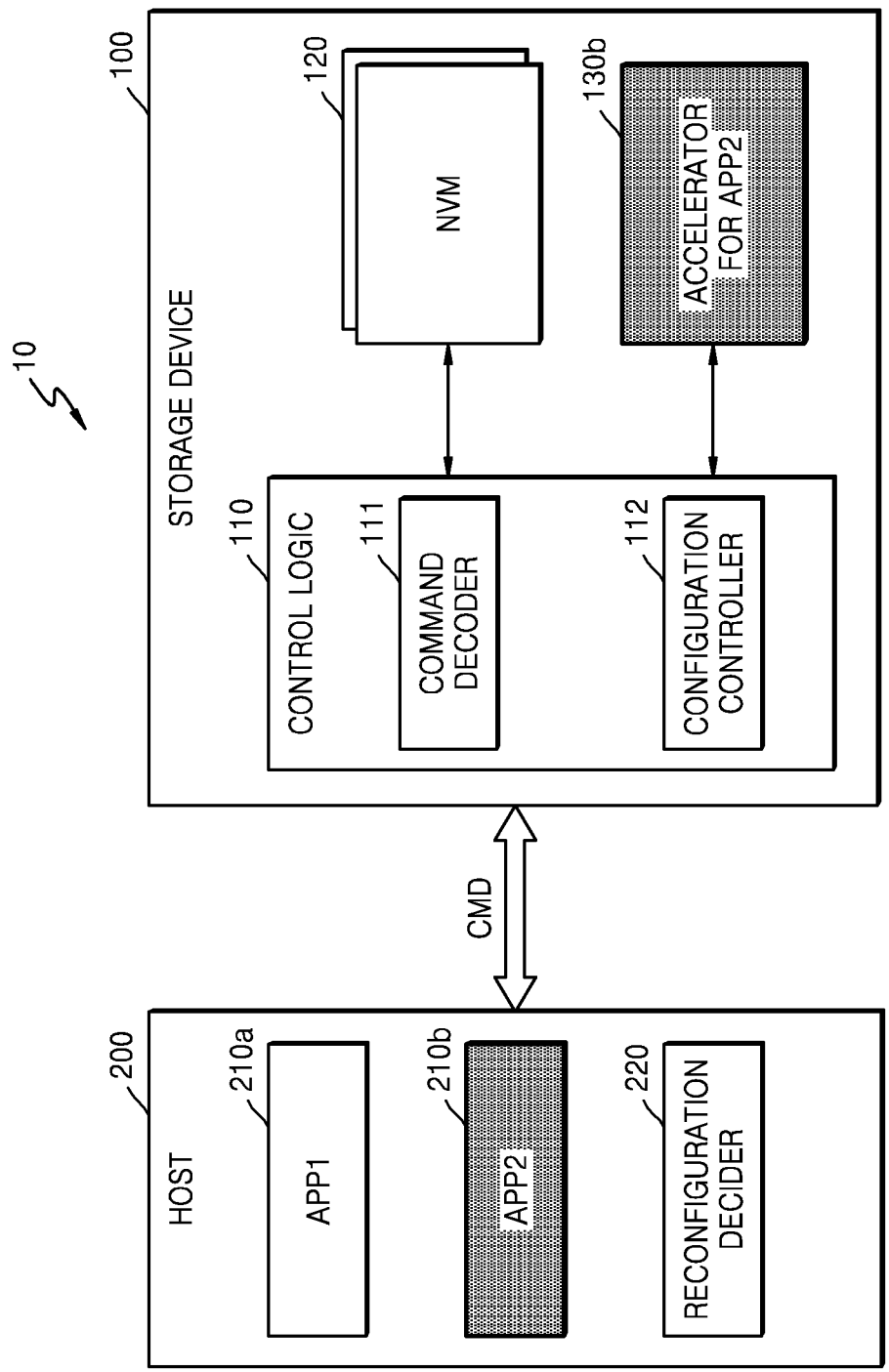
FIG. 5 is a block diagram illustrating an example in which a reconfigurable logic circuit included in a storage device included in the storage system of FIG. 1 is reconfigured to a second accelerator.

FIG. 5 is a block diagram illustrating an example in which the reconfigurable logic 130 included in the storage device 100 of FIG. 1 is reconfigured to a second accelerator 130b.

Referring to FIG. 5, when the second application APP2 210b is executed, the reconfiguration decider 220 may decide reconfiguration of the reconfigurable logic 130 so that the reconfigurable logic 130 may perform a function corresponding to the second application APP2 210b. Accordingly, the reconfigurable logic 130 may be reconfigured to the second accelerator 130b with respect to the second application APP2 210b.

For example, the second application APP2 210b may be a multimedia reproducing application, and the second accelerator 130b may perform transcoding necessary for multimedia reproduction. The transcoding means an operation of converting a file format, a resolution, and an image quality of multimedia content. According to an embodiment, the host 200 may provide the storage device 100 with a second design file for reconfiguring the reconfigurable logic 130 to the second accelerator 130b. That is, the host 200 may be configured to transmit, to the storage device 100, the second design file for programming the reconfigurable logic 130 into the second accelerator 130b.

Figure 6:
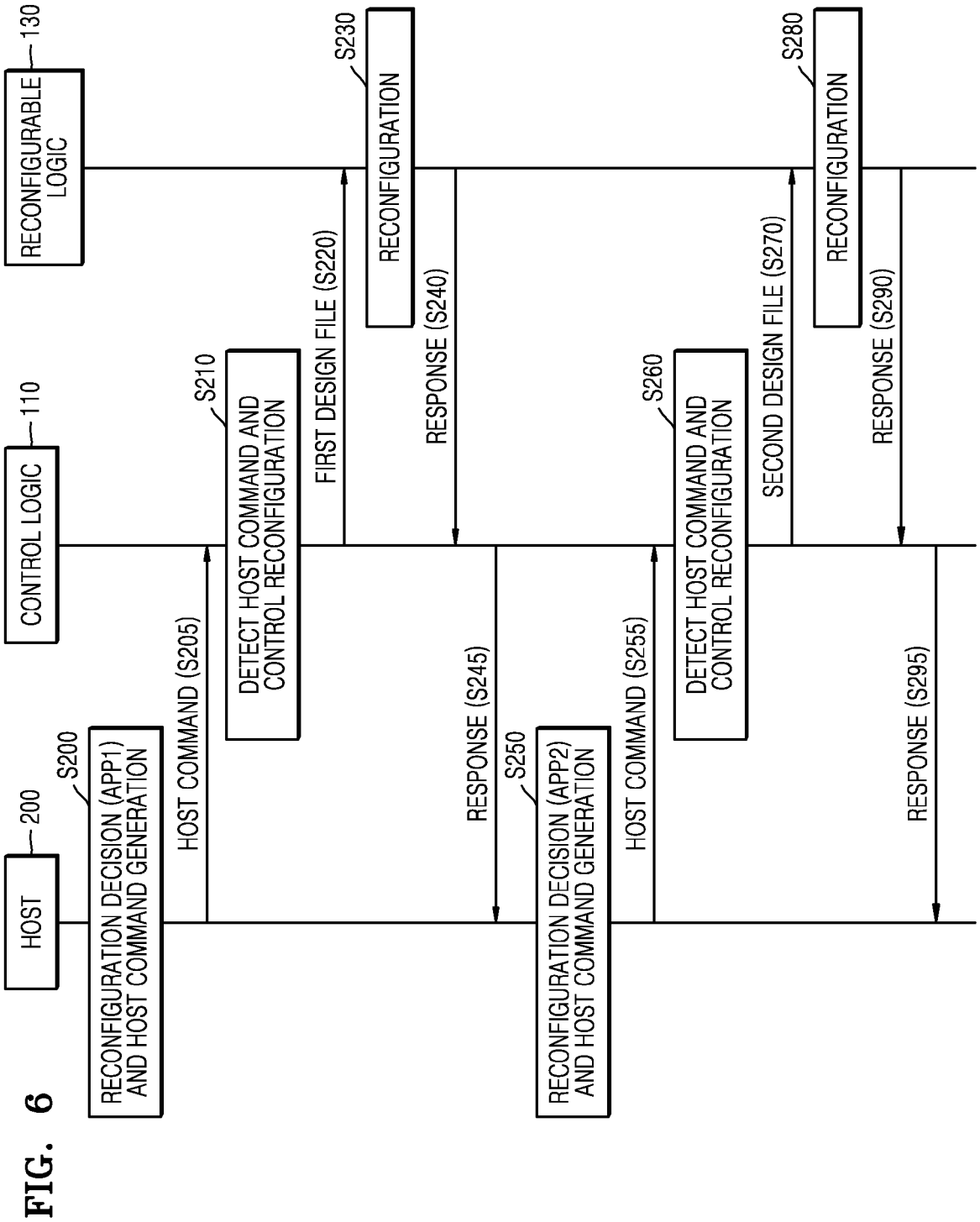
FIG. 6 is a flowchart illustrating an operation between a host, a control logic circuit, and a reconfigurable logic circuit according to an embodiment of the present disclosure.

FIG. 6 is a flowchart illustrating an operation between the host 200, the control logic 110, and the reconfigurable logic 130, according to an embodiment of the present disclosure.

Referring to FIG. 6, the operation between the host 200, the control logic 110, and the reconfigurable logic 130 corresponds to the embodiments of FIGS. 4 and 5. In operation S200, the host 200 decides that the reconfigurable logic 130 is reconfigured to the first accelerator 130a for the first application APP1 210a and generates the host command CMD. For example, the first application APP1 210a may be a multimedia reproducing application, and the host command CMD may include a transcoding request. In operation S205, the host 200 transmits the host command CMD to the control logic 110.

In operation S210, the control logic 110 detects the host command CMD and controls the reconfigurable logic 130 to be reconfigured. For example, the command decoder 111 may detect the transcoding request from the host command CMD. According to an embodiment, the command decoder 111 may determine whether a first design file corresponding to the transcoding request has been programmed in the reconfigurable logic 130. According to an embodiment, the command decoder 111 may determine whether the first design file corresponding to the transcoding request has been stored in a memory included in the storage device 100.

In operation S220, the control logic 110 transmits a first design file corresponding to the first application APP1 210a to the reconfigurable logic 130. In operation S230, the reconfigurable logic 130 is configured to have a function corresponding to the first application APP1 210a, by downloading the first design file. Accordingly, the reconfigurable logic 130 may be implemented using the first accelerator 130a. For example, the reconfigurable logic 130 may perform transcoding corresponding to the multimedia reproducing application by downloading a first design file corresponding to transcoding. In operation S240, the reconfigurable logic 130 transmits a response message indicating reconfiguration completion to the control logic 110. In operation S245, the control logic 110 transmits the response message indicating reconfiguration completion to the host 200.

In operation S250, the host 200 decides that the reconfigurable logic 130 is reconfigured to the second accelerator 130b for the second application APP2 210b and generates the host command CMD. For example, the second application APP2 210b may be a voice recognition application, and the host command CMD may include a CNN request. In operation S255, the host 200 transmits the host command CMD to the control logic 110.

In operation S260, the control logic 110 detects the host command CMD and controls the reconfigurable logic 130 to be reconfigured. For example, the command decoder 111 may detect the CNN request from the host command CMD. According to an embodiment, the command decoder 111 may determine whether a second design file corresponding to the CNN request has been programmed in the reconfigurable logic 130. According to an embodiment, the command decoder 111 may determine whether the second design file corresponding to the CNN request has been stored in the memory included in the storage device 100.

In operation S270, the control logic 110 transmits the second design file corresponding to the second application APP2 210b to the reconfigurable logic 130. In operation S280, the reconfigurable logic 130 is configured to have a function corresponding to the second application APP2 210b, by downloading the second design file. Accordingly, the reconfigurable logic 130 may be implemented using the second accelerator 130b. For example, the reconfigurable logic 130 may perform a CNN corresponding to a voice recognition application by downloading the second design file corresponding to a CNN. In operation S290, the reconfigurable logic 130 transmits a response message indicating completion of reconfiguration to the control logic 110. In operation S295, the control logic 110 transmits the response message indicating completion of reconfiguration to the host 200.

As described above with reference to FIGS. 4 through 6, according to the present embodiment, when an application executed by the host 200 is changed, the host 200 may provide a host command CMD to the storage device 100, and the reconfigurable logic 130 may be changed from the first accelerator 130a to the second accelerator 130b according to the host command CMD. However, the inventive concept(s) of the present disclosure are not limited thereto, and the reconfigurable logic 130 may be partially reconfigured according to the host command CMD.

The reconfigurable logic 130 may also be reconfigured to perform more calculations according to hardware resources. For example, when the reconfigurable logic 130 has sufficiently many hardware resources, the reconfigurable logic 130 may further perform a calculation corresponding to the second accelerator 130b according to the host command CMD while operating as the first accelerator 130a, and, accordingly, the reconfigurable logic 130 may be reconfigured to perform calculations corresponding to the first accelerator 130a and the second accelerator 130b.

Figure 7:
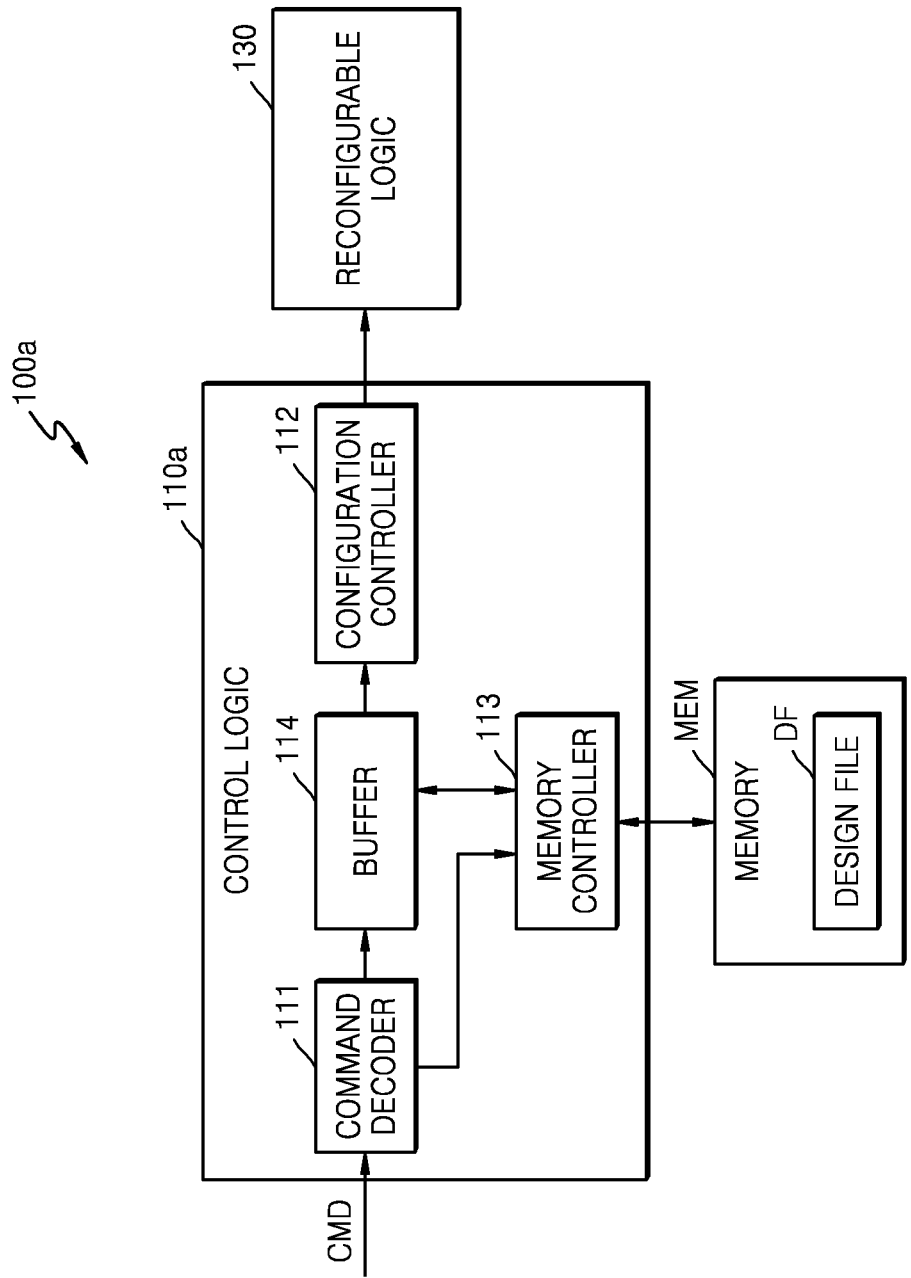
FIG. 7 is a block diagram illustrating an example of a storage device according to an embodiment of the present disclosure.

FIG. 7 is a block diagram illustrating a storage device 100a, which is an example of a storage device according to an embodiment of the present disclosure.

Referring to FIG. 7, the storage device 100a may include a control logic 110a, the reconfigurable logic 130, and a memory MEM. The control logic 110a may include the command decoder 111, the configuration controller 112, a memory controller 113, and a buffer 114. The storage device 100a corresponds to a modification of the storage device 100 of FIG. 1, and redundant descriptions thereof will now be omitted.

The command decoder 111 may receive the host command CMD and may decode the received host command CMD to thereby detect information about a function required by the host 200. According to an embodiment, the command decoder 111 may determine whether a design file currently programmed in the reconfigurable logic 130 corresponds to the function required by the host 200. The command decoder 111 may load a design file received from the host 200 to the buffer 114.

According to an embodiment, the command decoder 111 may determine whether a design file corresponding to the detected information has been stored in the memory MEM, by referring to a mapping table. When it is determined that the design file has been stored in the memory MEM, the command decoder 111 may output a control signal instructing a control operation of the memory controller 113. On the other hand, when it is determined that the design file has not been stored in the memory MEM, the command decoder 111 may transmit a response message to the host 200.

The memory controller 113 may receive the control signal from the command decoder 111 and may control a read operation with respect to the memory MEM in response to the received control signal. That is, the memory controller 113 may be configured to control the read operation for reading the design file from the NVM 120. The memory controller 113 may provide the read design file to the configuration controller via the buffer 114. In detail, the memory controller 113 may transmit a read command to the memory MEM. The memory MEM may store a design file DF for reconfiguring the reconfigurable logic 130. According to an embodiment, the memory MEM may be the NVM 120 of FIG. 1. According to an embodiment, the memory MEM may be, for example, volatile memory such as DRAM. The memory MEM may output the design file DF by performing a read operation in response to the read command. The memory controller 113 may receive the design file DF from the memory MEM and may load the received design file DF into the buffer 114.

The buffer 114 may buffer the design file DF received from the host 200 or the memory MEM and may provide the buffered design file DF to the configuration controller 112. For example, the buffer 114 may be Static Random-Access Memory (SRAM) or a First In First Out (FIFO) buffer. For example, the buffer 114 may be implemented using volatile memory, such as DRAM, or non-volatile memory, such as PRAM or flash memory. According to an embodiment, when an operating speed of the memory controller 113 is greater than that of the configuration controller 112, the memory controller 113 may buffer the design file DF in the buffer 114. According to an embodiment, the memory controller 113 may provide the design file DF directly to the configuration controller 112, rather than via the buffer 114.

The configuration controller 112 may download or program the design file DF into the reconfigurable logic 130. Although the configuration controller 112 is illustrated as being included in the control logic 110a, the configuration controller 112 is not limited thereto. According to some embodiments, the configuration controller 112 may be implemented to be included in the reconfigurable logic 130, for example, may be implemented in an FPGA.

Figure 8:
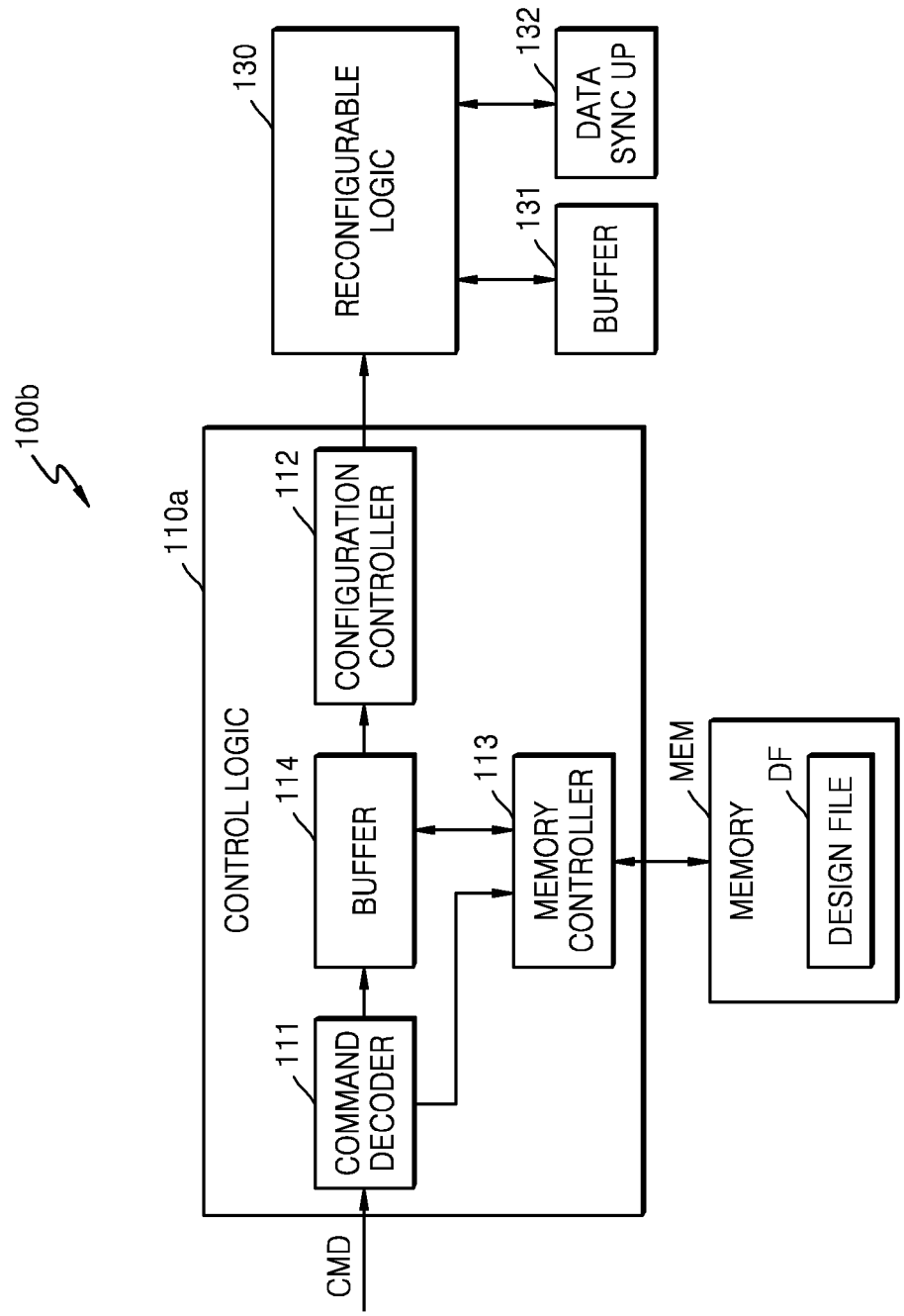
FIG. 8 is a block diagram illustrating another example of a storage device according to an embodiment of the present disclosure.

FIG. 8 is a block diagram illustrating a storage device 100b, which is another example of a storage device according to an embodiment of the present disclosure.

The storage device 100b of FIG. 8 corresponds to a modification of the storage device 100a of FIG. 7, and only differences between the storage device 100b and the storage device 100a of FIG. 7 are described. The storage device 100b may further include a buffer 131 and a data sync up logic 132, in addition to the components of the storage device 100a of FIG. 7. The buffer 131 may be a dedicated buffer of the reconfigurable logic 130 and may buffer a result of a calculation of the reconfigurable logic 130. Because the reconfigurable logic 130 may perform a calculation at high speed, the buffer 131 may be implemented to be adjacent to the reconfigurable logic 130, for example, may be implemented in an FPGA, thereby preventing performance degradation of the reconfigurable logic 130.

The data sync up logic 132 may sync up data necessary for a calculation operation of the reconfigurable logic 130. For example, when the reconfigurable logic 130 is configured to a first accelerator, for example, the first accelerator 130a of FIG. 4, data used in the first accelerator 130a may also be needed when the reconfigurable logic 130 has been reconfigured to a second accelerator, for example, the second accelerator 130b of FIG. 5. Accordingly, the data sync up logic 132 may sync up the data used in the first accelerator 130a with data that is to be used in the second accelerator 130b. For example, the data sync up logic 132 may be implemented using a portion of an FPGA. For example, the data sync up logic 132 may include memory.

Figure 9:
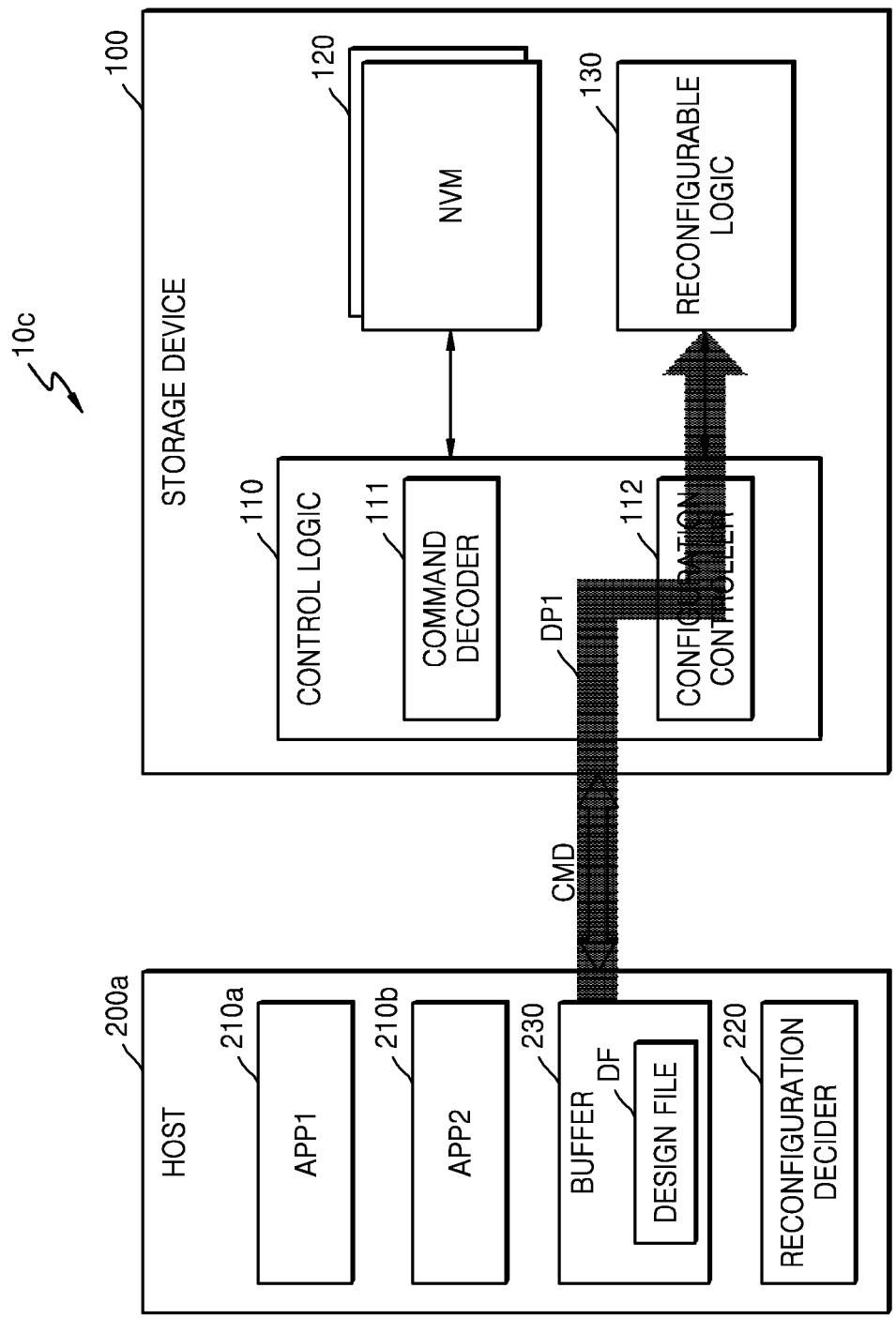
FIG. 9 is a block diagram illustrating a first data path in a storage system according to an embodiment of the present disclosure.

FIG. 9 is a block diagram illustrating a first data path DP1 in a storage system 10c according to an embodiment of the present disclosure.

Referring to FIG. 9, a host 200a corresponds to a modification of the host 200 of FIG. 1 and may further include a buffer 230 that stores the design file DF, compared with the host 200 of FIG. 1. The buffer 230 may buffer multiple design files respectively corresponding to applications executable by the host 200a.

The host 200a may provide the design file DF to the storage device 100. The design file DF may be provided to the reconfigurable logic 130 along the first data path DP1. In detail, the design file DF may be provided from the buffer 230 of the host 200a to the reconfigurable logic 130 via the configuration controller 112. According to some embodiments, the design file DF may be provided to the reconfigurable logic 130 via a buffer (for example, the buffer 114 of FIG. 7) and the configuration controller 112 within the control logic 110.

Figure 10:
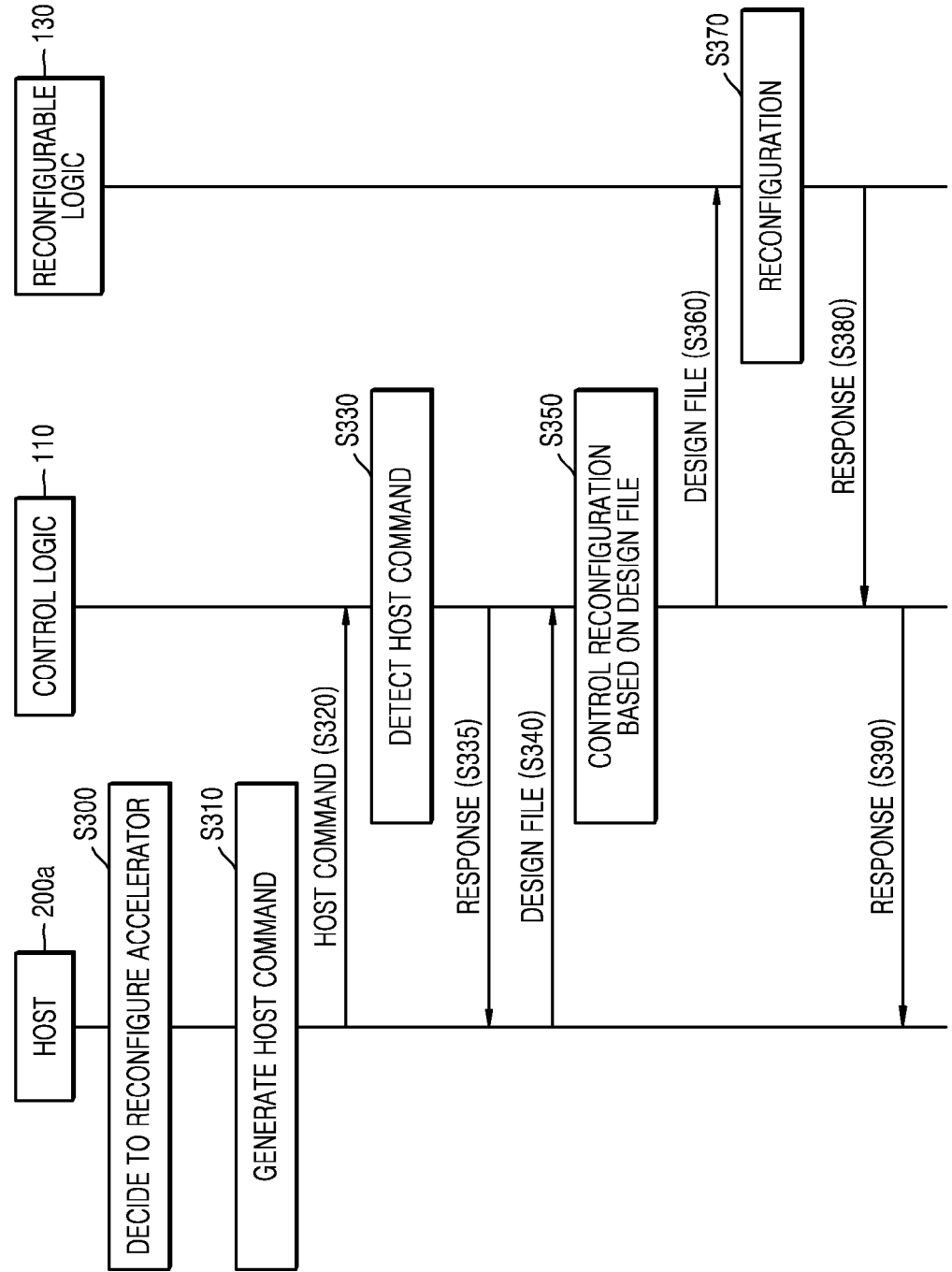
FIG. 10 is a flowchart illustrating an example of an operation between a host, a control logic circuit, and a reconfigurable logic circuit included in the storage system of FIG. 9.

FIG. 10 is a flowchart illustrating an example of an operation between the host 200a, the control logic 110, and the reconfigurable logic 130 of FIG. 9.

Referring to FIG. 10, the host 200a decides reconfiguration of an accelerator, namely, the reconfigurable logic 130, in operation S300. For example, the reconfiguration decider 220 may decide reconfiguration of the reconfigurable logic 130 according to the type of application that is executed by the host 200a. In operation S310, the host 200a generates a host command CMD including information about a function required by the host 200a, information about an application executed by the host 200a, or information about a design file corresponding to the application executed by the host 200a. In operation S320, the host 200a transmits the host command CMD to the control logic 110. In operation S330, the control logic 110 detects the information about the function required by the host 200a from the host command CMD and transmits a response message to the host 200a.

According to an embodiment, the control logic 110 may determine whether the detected function has been programmed in the reconfigurable logic 130. According to an embodiment, the control logic 110 may include a table that stores a design file currently programmed in the reconfigurable logic 130. The control logic 110 may detect, from the table, the design file currently programmed in the reconfigurable logic 130. Then, the control logic 110 may determine whether the detected design file corresponds to the function detected from the host command CMD. When it is determined that the detected design file corresponds to the function detected from the host command CMD, the control logic 110 may transmit, to the host 200a, a response message indicating that the function required by the host 200a has been implemented in the reconfigurable logic 130, in operation S335. On the other hand, when it is determined that the detected design file does not correspond to the function detected from the host command CMD, the control logic 110 may transmit, to the host 200a, a response message requesting the host 200a to transmit a design file, in operation S335.

According to an embodiment, the control logic 110 may determine whether the design file corresponding to the detected function has been stored in the storage device 100, by referring to a mapping table. When it is determined that the design file has not been stored in the storage device 100, the control logic 110 may transmit, to the host 200a, a response message requesting the host 200a to transmit a design file, in operation S335. However, the inventive concept(s) of the present disclosure are not limited thereto.

In operation S335, the control logic 110 may simply transmit a response message including only a result of the determination to the host 200a.

According to an embodiment, the control logic 110 may not determine whether the design file has been stored in the storage device 100. When decoding of the host command CMD is completed, the control logic 110 may transmit, to the host 200a, a response message requesting the host 200a to transmit a design file, in operation S335. However, the control logic 110 is not limited thereto. In operation S335, the control logic 110 may transmit, to the host 200a, a response message indicating that decoding of the host command CMD has been completed, in operation S335.

In operation S340, the host 200a transmits a design file to the control logic 110. In operation S350, the control logic 110 controls reconfiguration with respect to the reconfigurable logic 130, based on the design file. In operation S360, the control logic 110 transmits the design file to the reconfigurable logic 130. In operation S370, the reconfigurable logic 130 may be reconfigured to a component corresponding to the design file, by downloading the design file. In operation S380, the reconfigurable logic 130 transmits, to the control logic 110, a response message indicating that the reconfiguration has been completed. In operation S390, the control logic 110 transmits, to the host 200a, the response message indicating that the reconfiguration has been completed.

Figure 11:
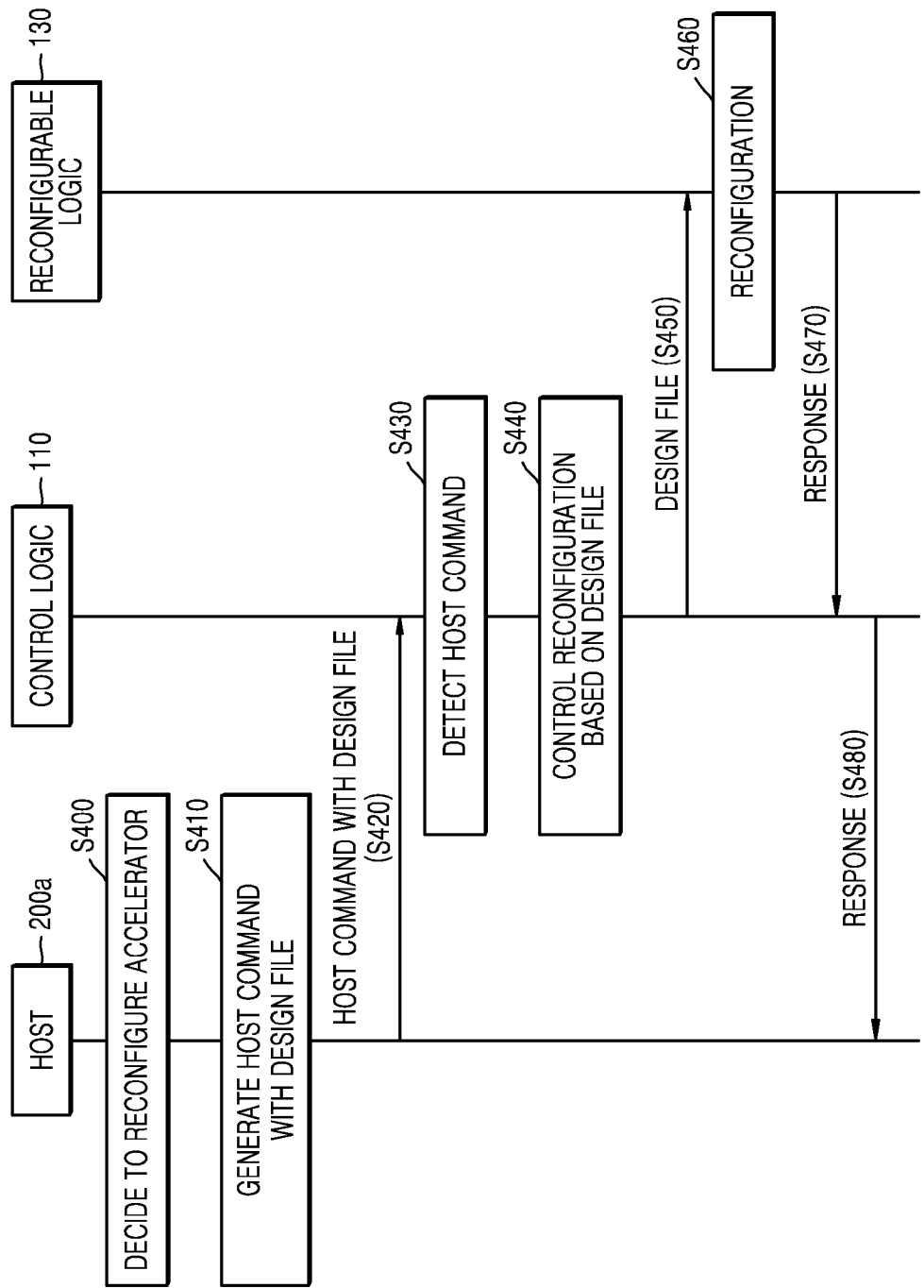
FIG. 11 is a flowchart illustrating another example of an operation between a host, a control logic circuit, and a reconfigurable logic circuit included in the storage system of FIG. 9.

FIG. 11 is a flowchart illustrating another example of an operation between the host 200a, the control logic 110, and the reconfigurable logic 130 of FIG. 9.

Referring to FIG. 11, the host 200a decides reconfiguration of an accelerator, namely, the reconfigurable logic 130, in operation S400. In operation S410, the host 200a generates a host command CMD including information about a function required by the host 200a and a design file corresponding to the function. In operation S420, the host 200a transmits the host command CMD including the design file to the control logic 110.

In operation S430, the control logic 110 receives the host command CMD and detects the information about the function required by the host 200a from the received host command CMD. The control logic 110 may buffer the design file in a buffer (for example, the buffer 114 of FIG. 7). In operation S440, the control logic 110 controls reconfiguration with respect to the reconfigurable logic 130, based on the design file. In operation S450, the control logic 110 transmits the design file to the reconfigurable logic 130. In operation S460, the reconfigurable logic 130 may be reconfigured to a component corresponding to the design file, by downloading the design file. In operation S470, the reconfigurable logic 130 transmits, to the control logic 110, a response message indicating that the reconfiguration has been completed. In operation S480, the control logic 110 transmits, to the host 200a, the response message indicating that the reconfiguration has been completed.

Figure 12:
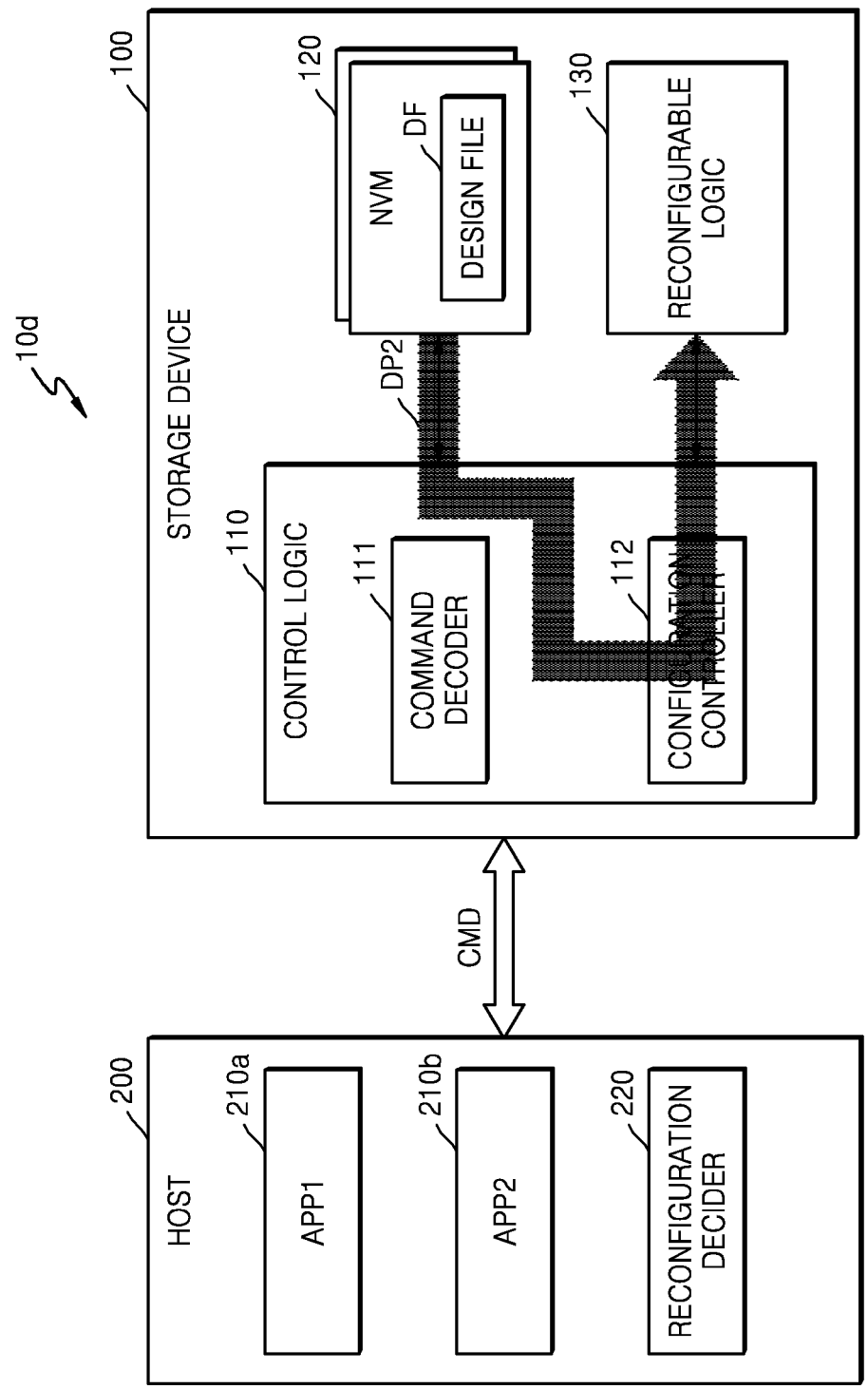
FIG. 12 is a block diagram illustrating a second data path in a storage system according to an embodiment of the present disclosure.

FIG. 12 is a block diagram illustrating a second data path DP2 in a storage system 10d according to an embodiment of the present disclosure.

Referring to FIG. 12, the NVM 120 may store a design file DF. The host 200 may previously transmit multiple design files to the storage device 100, in order to reconfigure the reconfigurable logic 130 in real time. Accordingly, the NVM 120 may store multiple design files respectively corresponding to applications executable by the host 200.

The design file DF may be provided to the reconfigurable logic 130 along the second data path DP2. In detail, the design file DF may be provided from the NVM 120 to the reconfigurable logic 130 via the configuration controller 112. According to some embodiments, the design file DF may be provided to the reconfigurable logic 130 via a buffer (for example, the buffer 114 of FIG. 7) and the configuration controller 112 within the control logic 110.

Figure 13:
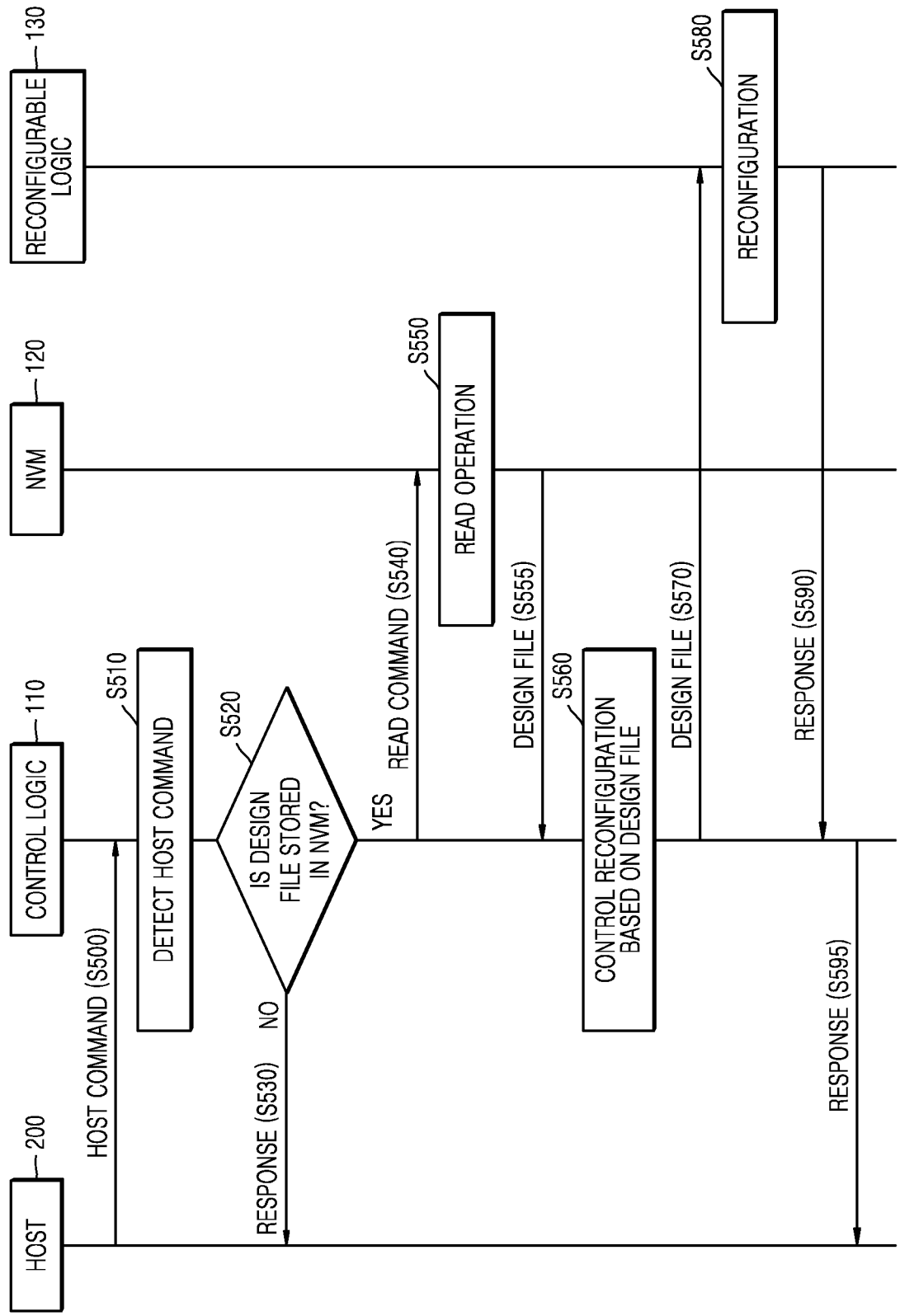
FIG. 13 is a flowchart illustrating an example of an operation between a host, a control logic circuit, and a reconfigurable logic circuit included in the storage system of FIG. 12.

FIG. 13 is a flowchart illustrating an example of an operation between the host 200, the control logic 110, the NVM 120, and the reconfigurable logic 130 of FIG. 12.

Referring to FIG. 13, the host 200 decides reconfiguration of an accelerator, namely, the reconfigurable logic 130, and transmits a host command CMD including information about a function required by the host 200 to the control logic 110, in operation S500. In operation S510, the control logic 110 detects the information about the function required by the host 200 from the received host command CMD.

In operation S520, the control logic 110 determines whether a design file DF corresponding to the detected function has been stored in the NVM 120, by referring to a mapping table. When it is determined that the design file DF has not been stored in the NVM 120, the control logic 110 transmits a response message to the host 200, in operation S530. According to an embodiment, operations S340 through S390 of FIG. 10 may be performed after operation S530.

On the other hand, when it is determined that the design file DF has been stored in the NVM 120, the control logic 110 transmits a read command to the NVM 120, in operation S540. The NVM 120 performs a read operation in response to the read command, in operation S550, and transmits the design file DF to the control logic 110, in operation S555. In operation S560, the control logic 110 controls reconfiguration with respect to the reconfigurable logic 130, based on the design file DF.

In operation S570, the control logic 110 transmits the design file DF to the reconfigurable logic 130. In operation S580, the reconfigurable logic 130 may be reconfigured to a component corresponding to the design file DF, by downloading the design file DF. In operation S590, the reconfigurable logic 130 transmits, to the control logic 110, a response message indicating that the reconfiguration has been completed. In operation S595, the control logic 110 transmits, to the host 200, the response message indicating that the reconfiguration has been completed.

Figure 14:
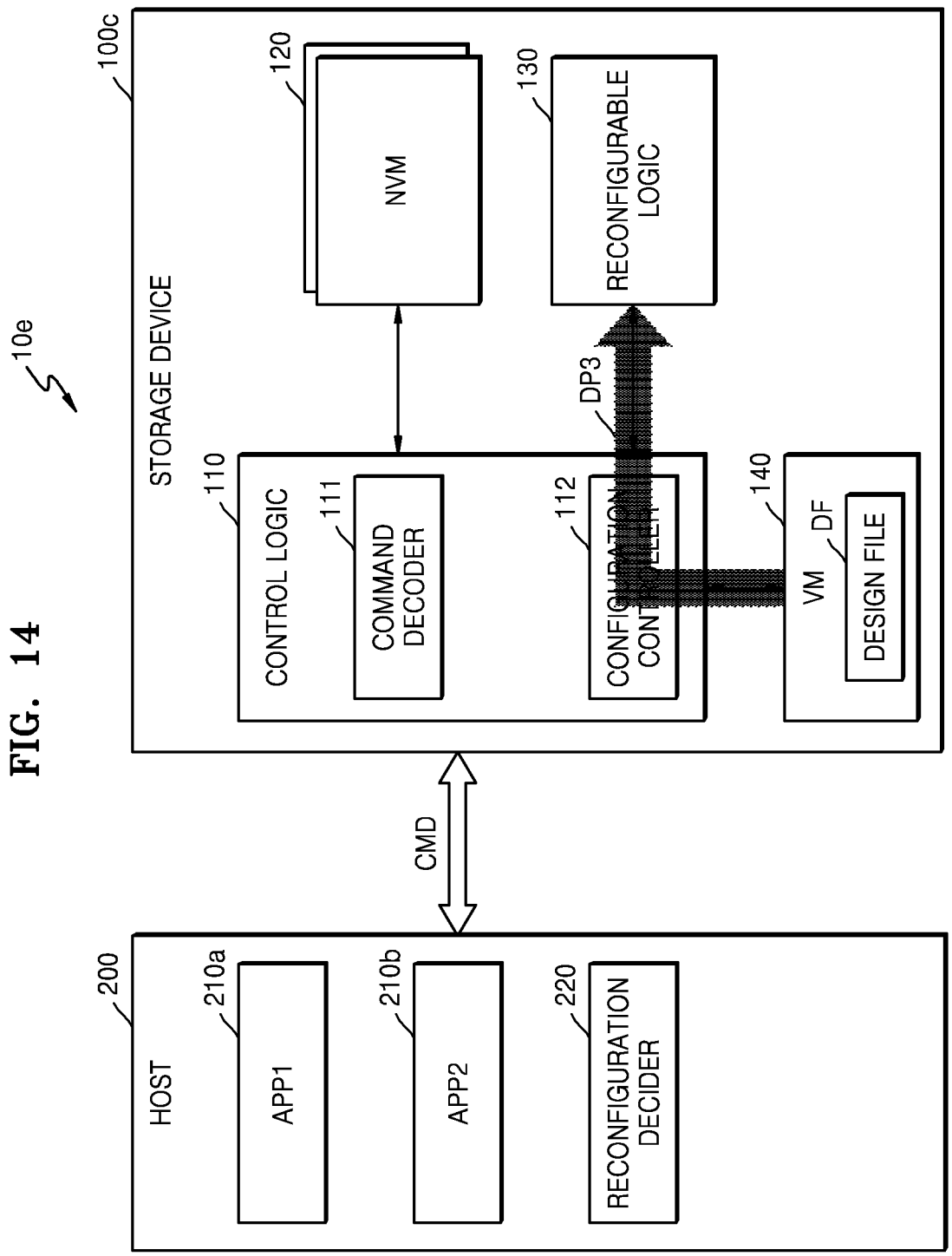
FIG. 14 is a block diagram illustrating a third data path in a storage system according to an embodiment of the present disclosure.

FIG. 14 is a block diagram illustrating a third data path DP3 in a storage system 10e according to an embodiment of the present disclosure.

Referring to FIG. 14, a storage device 100c corresponds to a modification of the storage device 100 of FIG. 1 and may further include VM 140 (volatile memory), compared with the storage device 100 of FIG. 1. The VM 140 may store a design file DF. The host 200 may previously transmit multiple design files to the storage device 100c, in order to reconfigure the reconfigurable logic 130 in real time. Accordingly, the VM 140 may store multiple design files respectively corresponding to applications executable by the host 200.

The design file DF may be provided to the reconfigurable logic 130 along the third data path DP3. In detail, the design file DF may be provided from the VM 140 to the reconfigurable logic 130 via the configuration controller 112. According to some embodiments, the design file DF may be provided to the reconfigurable logic 130 via a buffer (for example, the buffer 114 of FIG. 7) and the configuration controller 112 in the control logic 110.

Figure 15:
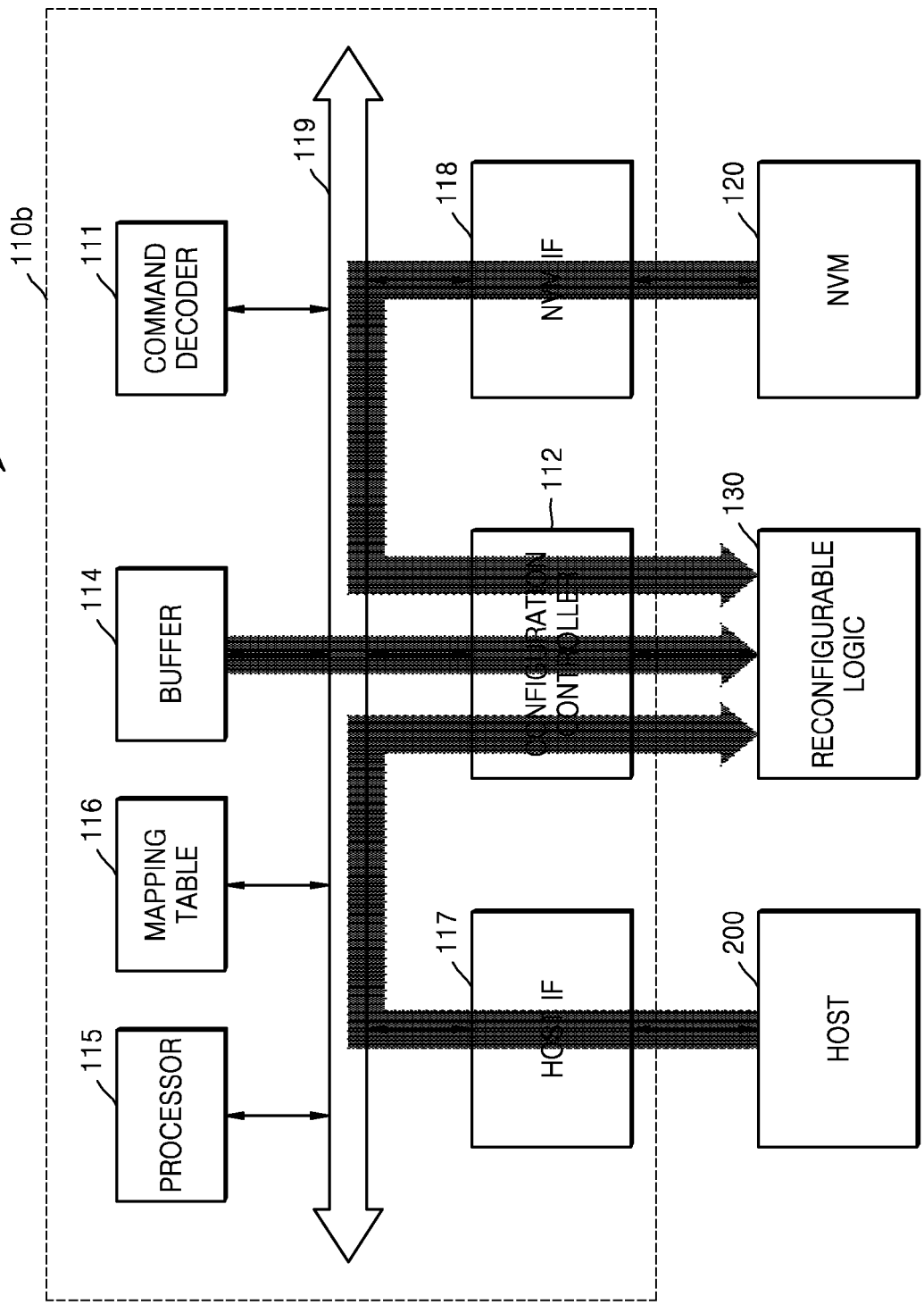
FIG. 15 is a block diagram illustrating various data paths in a storage system according to an embodiment of the present disclosure.

FIG. 15 is a block diagram illustrating various data paths in a storage system 10f according to an embodiment of the present disclosure.

Referring to FIG. 15, a control logic 110b may include the command decoder 111, the configuration controller 112, the buffer 114, a processor 115, a mapping table 116, a host interface (IF) 117, and an NVM IF 118, which communicate with each other via a bus 119. The control logic 110b may correspond to a modification of the control logic 110a of FIG. 8, and repeated descriptions thereof will be omitted.

The processor 115 may include a central processing unit or a micro-processor. Additionally, the processor may control an overall operation of the control logic 110b. According to an embodiment, the processor 115 may be implemented using a multi-core processor, for example, a dual core processor or a quad core processor.

The mapping table 116 may store physical addresses at which multiple design files have been written. According to an embodiment, the mapping table 116 may store physical addresses of the NVM 120 at which design files have been written. This will be described in greater detail below with reference to FIG. 16A. According to an embodiment, the mapping table 116 may store physical addresses of VM (for example, the VM 140 of FIG. 14) at which design files have been written. This will be described in greater detail below with reference to FIG. 16B. The mapping table 116 may be loaded into memory.

The host IF 117 may provide an IF between the host 200 and the control logic 110b, for example, a Universal Serial Bus (USB), an MMC, PCIExpress (PCI-E), AT Attachment (ATA), Serial AT Attachment (SATA), Parallel AT Attachment (PATA), a Small Computer System Interface (SCSI), a Serial Attached SCSI (SAS), an Enhanced Small Disk Interface (ESDI), and an IF based on Integrated Drive Electronics (IDE) or the like.

The NVM IF 118 may provide an IF between the control logic 110b and the NVM 120. According to an embodiment, the memory controller 113 of FIG. 8 may be implemented in the NVM IF 118. For example, a read command, a write command, or data may be transmitted or received between the control logic 110b and the NVM 120 via the NVM IF 118. According to an embodiment, a number of NVM IFs may correspond to the number of channels between the control logic 110b and the NVM 120.

According to an embodiment, the host IF 117 may receive a design file from the host 200 and provide the received design file to the configuration controller 112, and the configuration controller 112 may program the design file into the reconfigurable logic 130. According to an embodiment, the buffer 114 may provide a design file to the configuration controller 112, and the configuration controller 112 may program the design file into the reconfigurable logic 130. According to an embodiment, the NVM IF 118 may receive a design file from the NVM 120 and provide the received design file to the configuration controller 112, and the configuration controller 112 may program the design file into the reconfigurable logic 130.

Figure 16A:
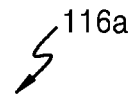
FIG. 16A illustrates a mapping table for non-volatile memory according to an embodiment of the present disclosure.

FIG. 16A illustrates a mapping table 116a for non-volatile memory NVM according to an embodiment of the present disclosure.

Referring to FIG. 16A, the mapping table 116a may store physical addresses at which first through third design files DF1a, DF2a, and DF3a have been stored. For example, the mapping table 116a may be stored in the control logic 110 of FIG. 12. For example, according to the mapping table 116a, the first design file DF1a may be stored at a first physical address PPN1a of NVM (for example, the NVM 120 of FIG. 12), the second design file DF2a may be stored at a second physical address PPN2a of the NVM, and the third design file DF3a may be stored at a third physical address PPN3a of the NVM.

Figure 16B:
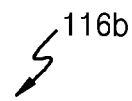
FIG. 16B illustrates a mapping table for volatile memory according to an embodiment of the present disclosure.

FIG. 16B illustrates a mapping table 116b for volatile memory VM according to an embodiment of the present disclosure.

Referring to FIG. 16B, the mapping table 116b may store physical addresses at which first through third design files DF1b, DF2b, and DF3b have been stored. For example, the mapping table 116b may be stored in the control logic 110 of FIG. 14. For example, according to the mapping table 116b, the first design file DF1b may be stored at a first physical address PPN1b of VM, the second design file DF2b may be stored at a second physical address PPN2b of the VM, and the third the design file DF3b may be stored at a third physical address PPN3b of the VM.

Figure 17:
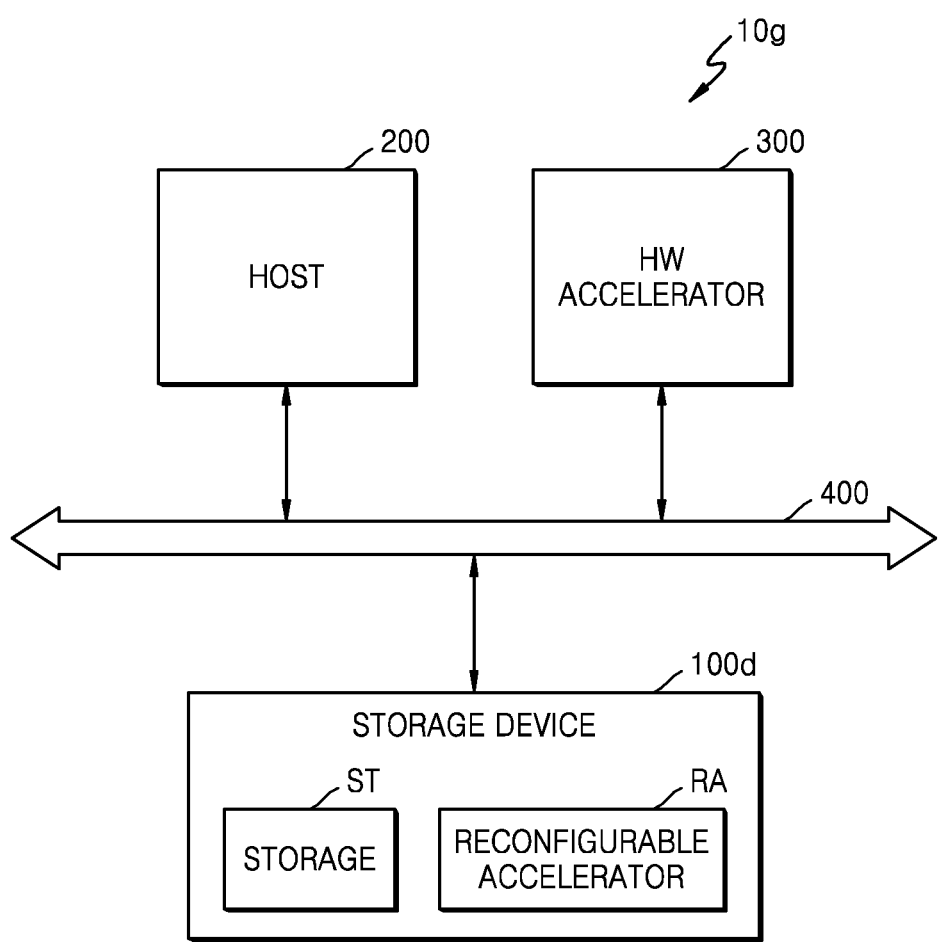
FIG. 17 is a block diagram illustrating a server according to an embodiment of the present disclosure.

FIG. 17 is a block diagram illustrating a storage system 10g according to an embodiment of the present disclosure.

Referring to FIG. 17, the storage system 10g may include a storage device 100d, the host 200, and a HW accelerator 300 (hardware accelerator), which may communicate with each other via a bus 400. For example, the storage system 10g may be a server or a data center. The storage device 100d may include a storage ST and a reconfigurable accelerator RA. As such, the storage system 10g may include both the HW accelerator 300 and the reconfigurable accelerator RA. In this case, the reconfigurable accelerator RA may be implemented within the storage device 100d.

The HW accelerator 300 may help a calculation of the host 200 by performing a pre-determined calculation from among calculations that are performed by the host 200. For example, the HW accelerator 300 may be a graphics processing unit (GPU). The reconfigurable accelerator RA may perform a calculation corresponding to an application that is currently executed by the host 200, by being reconfigured in real time according to the type of calculation performed by the host 200. As such, a calculation performed by the HW accelerator 300 is not changed during an operation of the storage system 10g, whereas a calculation performed by the reconfigurable accelerator RA may be changed during an operation of the storage system 10g.

According to the present embodiment, the storage device 100d may function as an existing storage device by including the storage ST, and the storage device 100d may also function as an accelerator for helping a calculation of the host 200, by further including the reconfigurable accelerator RA. In this case, due to the inclusion of the storage ST and the reconfigurable accelerator RA within the storage device 100d, a data processing speed between the storage ST and the reconfigurable accelerator RA may be increased.

Figure 18:
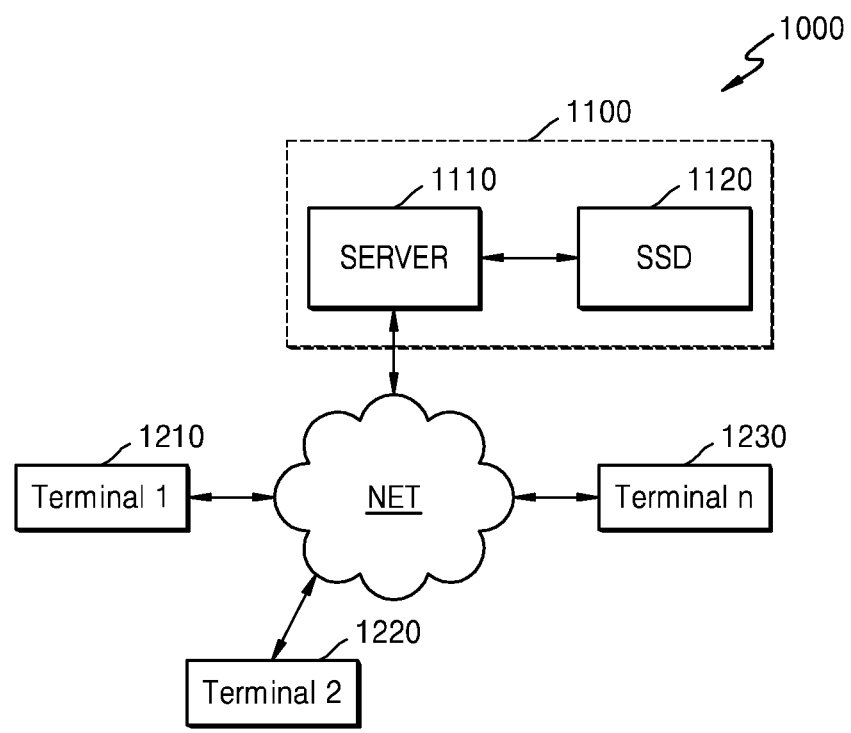
FIG. 18 is a block diagram illustrating a network system according to an embodiment of the present disclosure.

FIG. 18 is a block diagram illustrating a network system 1000 according to an embodiment of the present disclosure.

Referring to FIG. 18, the network system 1000 may include a server system 1100, and multiple terminals 1210 through 1230 communicating with the server system 1100 via a network NET. The server system 1100 may include a server 1110 and an SSD 1120. The SSD 1120 may correspond to the storage devices 100, 100', 100a, 100b, 100c, and 100d according to the above-described embodiments. According to some embodiments, the SSD 1120 may be implemented using the embodiments described above with reference to FIGS. 1 through 17.

Figure 19:
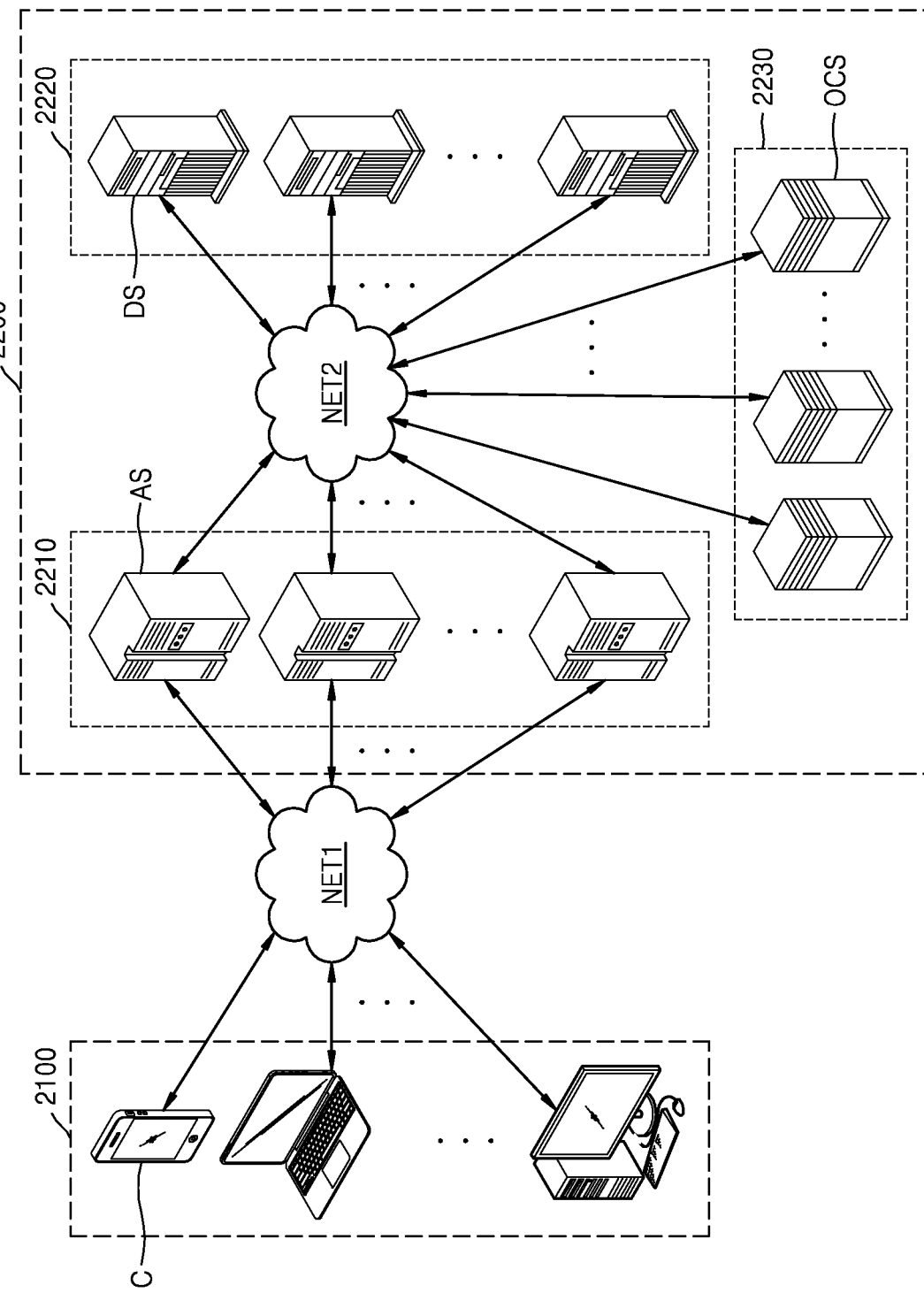
FIG. 19 is a block diagram illustrating a network system according to an embodiment of the present disclosure.

FIG. 19 is a block diagram illustrating a network system 2000 according to an embodiment of the present disclosure.

Referring to FIG. 19, the network system 2000 may include a client group 2100 and a data center 2200. The client group 2100 may include client devices C that communicate with the data center 2200 via a first network NET1, for example, the Internet. The data center 2200 is a facility that collects various types of data and provides a service, and may include an application server group 2210, a DB server group 2220 (database server group), and an object cache server group 2230 that communicate with each other via a second network NET2, for example, a local area network (LAN) or Intranet.

The application server group 2210 may include application server devices AS, and the application server devices AS may process requests received from the client group 2100 and may access the DB server group 2220 or the object cache server group 2230 according to the requests of the client group 2100. The DB server group 2220 may include DB server devices DS that store pieces of data processed by the application server devices AS. The object cache server group 2230 may include object cache server devices OCS that temporarily store the data stored in the DB server devices DS or data read from the DB server devices DS, and accordingly, may function as a cache between the application server devices AS and the DB server devices DS. According to an embodiment, the DB server devices DS may be implemented using the embodiments described above with reference to FIGS. 1 through 17.

While the inventive concept(s) of the present disclosure have been particularly shown and described with reference to exemplary embodiments thereof, it will be understood by those of ordinary skill in the art that various changes in form and details may be made therein without departing from the spirit and scope as defined by the following claims.

What is claimed is:

1. A storage device comprising:
   a memory cell array configured to store a design file corresponding a connection between logic blocks in a reconfigurable logic circuit for a neural network operation;
   the reconfigurable logic circuit configured to perform a convolutional neural network (CNN) operation or a recurrent neural network (RNN) operation as the neural network operation according to the design file; and
   a control logic configured to refer to a mapping table that stores physical addresses of the memory cell array and maps the design file to the physical addresses and provide the design file to the reconfigurable logic circuit for the neural network operation.

2. The storage device of claim 1, wherein the design file further corresponds to at least one of interconnections and input/output (I/O) cells in the reconfigurable logic circuit.

3. The storage device of claim 1, wherein the control logic is further configured to:
   receive, from a host, a host command including information about the neural network operation, and
   dynamically reconfigure the reconfigurable logic circuit such that the reconfigurable logic circuit performs the CNN operation or the RNN operation according to the host command.

4. The storage device of claim 1, wherein the memory cell array and the reconfigurable logic circuit are implemented separately.

5. The storage device of claim 1, wherein the control logic and the reconfigurable logic circuit are implemented in a single chip.

6. The storage device of claim 1, wherein:
   the memory cell array is further configured to store a second design file, and
   the reconfigurable logic circuit is further configured to be changed between performing the neural network operation and performing an operation according to the second design file.

7. The storage device of claim 6, wherein the reconfigurable logic circuit is further configured to perform transcoding for multimedia reproduction as the operation.

8. The storage device of claim 6, wherein the reconfigurable logic circuit is further configured to perform at least one of inline processing, pre-processing, pre-filtering, cryptography, compression, and protocol bridging as the operation.

9. The storage device of claim 6, wherein the reconfigurable logic circuit is further configured to perform at least one of a sorting operation, a searching operation, a logic operation, and an arithmetic operation as the operation.

10. The storage device of claim 6, wherein the reconfigurable logic circuit is further configured to perform a machine learning algorithm as the operation.

11. The storage device of claim 6, wherein the reconfigurable logic circuit is further configured to be changed between performing the CNN operation and performing the RNN operation.

12. The storage device of claim 1, further comprising:
    a buffer configured to store a result of a calculation of the reconfigurable logic circuit; and
    a data sync up logic configured to sync up data necessary for the calculation of the reconfigurable logic circuit.

13. The storage device of claim 12, wherein the buffer is further configured to be dedicated to the reconfigurable logic circuit.

14. The storage device of claim 12, wherein the data sync up logic is further configured to sync up data used in the neural network operation with data that is to be used in the calculation.

15. The storage device of claim 1, wherein the memory cell array includes at least one of a NAND flash memory array and a volatile memory cell array.

16. An operating method of a storage device including a memory cell array, a reconfigurable logic circuit and a control logic, the operating method comprising:
    storing a design file in the memory cell array, the design file corresponding to a connection between logic blocks in the reconfigurable logic circuit for a neural network operation;
    generating, by the control logic, a mapping table that maps the design file to a corresponding physical address within the memory cell array;
    providing, by the control logic, the design file to the reconfigurable logic circuit for the neural network operation; and
    performing, by the reconfigurable logic circuit, a convolutional neural network (CNN) operation or a recurrent neural network (RNN) operation as the neural network operation according to the design file.

17. The operating method of claim 16, wherein the design file further corresponds to at least one of interconnections and input/output (I/O) cells in the reconfigurable logic circuit.

18. The operating method of claim 16, further comprising buffering a result of a calculation of the reconfigurable logic circuit in a buffer.

19. The operating method of claim 18, further comprising syncing up data necessary for the calculation of the reconfigurable logic circuit by using a data sync up logic.

20. A storage device comprising:
- a logic circuit including an accelerator to perform a convolutional neural network (CNN) operation or a recurrent neural network (RNN) operation as a neural network operation according to data;
- a memory cell array configured to store the data corresponding a connection between logic blocks in the logic circuit for the neural network operation;
- a control logic configured to refer to a mapping table that stores physical addresses of the memory cell array and maps the data to the physical addresses and to provide the data to the logic circuit for the neural network operation, wherein the mapping table is stored in the control logic; and
- a buffer configured to store a result of a calculation of the logic circuit, wherein:
- the logic circuit transmits a response message indicating that the neural network operation has been completed to the control logic,
- the data further corresponds to at least one of interconnections and input/output (I/O) cells in the logic circuit, and
- the memory cell array includes at least one of a NAND flash memory array and a volatile memory cell array.

21. The storage device of claim 20, wherein the control logic is further configured to:
- receive, from a host, a host command including information about the neural network operation, and
- dynamically reconfigure the logic circuit such that the logic circuit performs the CNN operation or the RNN operation according to the host command.

22. The storage device of claim 20, wherein the memory cell array and the logic circuit are implemented separately.

23. The storage device of claim 20, wherein the control logic and the logic circuit are implemented in a single chip.

24. The storage device of claim 20, wherein:
- the memory cell array is further configured to store additional data, and
- the logic circuit is further configured to be changed between performing the neural network operation and performing an operation according to the additional data.

25. The storage device of claim 24, wherein the logic circuit is further configured to perform transcoding for multimedia reproduction as the operation.

26. The storage device of claim 24, wherein the logic circuit is further configured to perform at least one of inline processing, pre-processing, pre-filtering, cryptography, compression, and protocol bridging as the operation.

27. The storage device of claim 24, wherein the logic circuit is further configured to perform at least one of a sorting operation, a searching operation, a logic operation, and an arithmetic operation as the operation.

28. The storage device of claim 24, wherein the logic circuit is further configured to perform a machine learning algorithm as the operation.

29. The storage device of claim 24, wherein the logic circuit is further configured to be changed between performing the CNN operation and performing the RNN operation.

30. The storage device of claim 20, wherein the buffer is further configured to be dedicated to the logic circuit.

31. The storage device of claim 20, further comprising a data sync up logic configured to sync up data necessary for the calculation of the logic circuit.

32. The storage device of claim 31, wherein the data sync up logic is further configured to sync up data used in the neural network operation with data that is to be used in the calculation.

33. The storage device of claim 1, further comprising:
- a host interface configured to provide an interface between a host and the control logic, wherein
- the interface is implemented by using a Universal Serial Bus (USB), an MMC, PCIExpress (PCI-E), AT Attachment (ATA), Serial AT Attachment (SATA), Parallel AT Attachment (PATA), a Small Computer System Interface (SCSI), a Serial Attached SCSI (SAS), an Enhanced Small Disk Interface (ESDI), or an IF based on Integrated Drive Electronics (IDE).

34. The operating method of claim 16, wherein an interface between the control logic and a host is implemented by using a Universal Serial Bus (USB), an MMC, PCIExpress (PCI-E), AT Attachment (ATA), Serial AT Attachment (SATA), Parallel AT Attachment (PATA), a Small Computer System Interface (SCSI), a Serial Attached SCSI (SAS), an Enhanced Small Disk Interface (ESDI), or an IF based on Integrated Drive Electronics (IDE).

35. The storage device of claim 20, further comprising:
- a host interface configured to provide an interface between a host and the control logic, wherein
- the interface is implemented by using a Universal Serial Bus (USB), an MMC, PCIExpress (PCI-E), AT Attachment (ATA), Serial AT Attachment (SATA), Parallel AT Attachment (PATA), a Small Computer System Interface (SCSI), a Serial Attached SCSI (SAS), an Enhanced Small Disk Interface (ESDI), or an IF based on Integrated Drive Electronics (IDE).

* * * * *